(12) United States Patent
Levesque, Jr. et al.

(10) Patent No.: US 10,756,003 B2
(45) Date of Patent: Aug. 25, 2020

(54) INORGANIC WAFER HAVING THROUGH-HOLES ATTACHED TO SEMICONDUCTOR WAFER

(71) Applicant: CORNING INCORPORATED, Corning, NY (US)

(72) Inventors: Daniel Wayne Levesque, Jr., Avoca, NY (US); Garrett Andrew Piech, Corning, NY (US); Aric Bruce Shorey, Pittsford, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/179,048

(22) Filed: Nov. 2, 2018

(65) Prior Publication Data
US 2019/0074240 A1   Mar. 7, 2019

Related U.S. Application Data

(62) Division of application No. 15/630,363, filed on Jun. 22, 2016, now Pat. No. 10,134,657.
(Continued)

(51) Int. Cl.
*H01L 23/48* (2006.01)
*H01L 21/311* (2006.01)
(Continued)

(52) U.S. Cl.
CPC .......... *H01L 23/481* (2013.01); *B81B 7/0006* (2013.01); *B81C 1/00301* (2013.01);
(Continued)

(58) Field of Classification Search
CPC . H01L 23/481; H01L 23/15; H01L 23/49727; H01L 21/268; H01L 21/30604;
(Continued)

(56) References Cited

U.S. PATENT DOCUMENTS

| 208,387 A | 9/1878 | George |
|---|---|---|
| 237,571 A | 2/1881 | Messier |

(Continued)

FOREIGN PATENT DOCUMENTS

| AU | 2011101310 A4 | 11/2011 |
|---|---|---|
| CN | 1096936 A | 1/1995 |

(Continued)

OTHER PUBLICATIONS

International Search Report and Written Opinion PCT/US2017/039357 dated Sep. 13, 2017.
(Continued)

*Primary Examiner* — Tu-Tu V Ho
(74) *Attorney, Agent, or Firm* — Amy T. Lang

(57) ABSTRACT

A process comprises bonding a semiconductor wafer to an inorganic wafer. The semiconductor wafer is opaque to a wavelength of light to which the inorganic wafer is transparent. After the bonding, a damage track is formed in the inorganic wafer using a laser that emits the wavelength of light. The damage track in the inorganic wafer is enlarged to form a hole through the inorganic wafer by etching. The hole terminates at an interface between the semiconductor wafer and the inorganic wafer. An article is also provided, comprising a semiconductor wafer bonded to an inorganic wafer. The semiconductor wafer is opaque to a wavelength of light to which the inorganic wafer is transparent. The inorganic wafer has a hole formed through the inorganic wafer. The hole terminates at an interface between the semiconductor wafer and the inorganic wafer.

13 Claims, 13 Drawing Sheets

Related U.S. Application Data

(60) Provisional application No. 62/356,067, filed on Jun. 29, 2016.

(51) Int. Cl.
| | |
|---|---|
| *H01L 23/498* | (2006.01) |
| *H01L 21/48* | (2006.01) |
| *H01L 23/15* | (2006.01) |
| *B81B 7/00* | (2006.01) |
| *B81C 1/00* | (2006.01) |
| *H01L 21/268* | (2006.01) |
| *H01L 21/306* | (2006.01) |
| *H01L 21/683* | (2006.01) |
| *H01L 21/762* | (2006.01) |
| *H01L 21/768* | (2006.01) |

(52) U.S. Cl.
CPC ...... *H01L 21/268* (2013.01); *H01L 21/30604* (2013.01); *H01L 21/31105* (2013.01); *H01L 21/31111* (2013.01); *H01L 21/486* (2013.01); *H01L 21/6835* (2013.01); *H01L 21/76251* (2013.01); *H01L 21/76877* (2013.01); *H01L 21/76898* (2013.01); *H01L 23/15* (2013.01); *H01L 23/49827* (2013.01); *B81B 2207/096* (2013.01); *B81C 2201/013* (2013.01); *B81C 2201/0143* (2013.01); *B81C 2203/031* (2013.01); *H01L 2221/68359* (2013.01)

(58) Field of Classification Search
CPC ......... H01L 21/31105; H01L 21/31111; H01L 21/486; H01L 21/6835; H01L 21/76251; H01L 21/76877; H01L 21/76898; H01L 2221/68359; B81B 7/0006; B81B 2207/096; B81C 1/00301; B81C 2201/013; B81C 2201/0143; B81C 2203/031
USPC .......................................................... 257/621
See application file for complete search history.

(56) References Cited

U.S. PATENT DOCUMENTS

| | | | |
|---|---|---|---|
| 3,798,013 A | 3/1974 | Hasegawa J et al. | |
| 4,395,271 A | 7/1983 | Beall et al. | |
| 4,547,836 A * | 10/1985 | Anthony | H01L 35/32 |
| | | | 361/748 |
| 4,948,941 A | 8/1990 | Altman et al. | |
| 5,089,062 A | 2/1992 | Pavlik et al. | |
| 5,166,493 A | 11/1992 | Inagawa et al. | |
| 5,208,068 A | 5/1993 | Davis et al. | |
| 5,314,522 A | 5/1994 | Kondo et al. | |
| 5,374,291 A | 12/1994 | Yabe et al. | |
| 5,493,096 A | 2/1996 | Koh | |
| 5,575,291 A | 11/1996 | Hayakawa et al. | |
| 5,575,936 A | 11/1996 | Goldfarb | |
| 5,745,236 A | 4/1998 | Haga | |
| 5,746,884 A | 5/1998 | Gupta et al. | |
| 5,844,200 A | 12/1998 | Leader et al. | |
| 5,879,424 A | 3/1999 | Nishii et al. | |
| 5,909,284 A | 6/1999 | Nakamura | |
| 5,919,607 A | 7/1999 | Lawandy | |
| 5,933,230 A | 8/1999 | Imaino et al. | |
| 5,965,043 A | 10/1999 | Noddin et al. | |
| 6,072,624 A | 6/2000 | Dixon et al. | |
| 6,120,131 A | 9/2000 | Murthy et al. | |
| 6,143,382 A | 11/2000 | Koyama et al. | |
| 6,224,713 B1 | 5/2001 | Hembree et al. | |
| 6,234,755 B1 | 5/2001 | Bunker et al. | |
| 6,319,867 B1 | 11/2001 | Chacon et al. | |
| 6,344,242 B1 | 2/2002 | Stolk et al. | |
| 6,391,213 B1 | 5/2002 | Homola | |
| 6,399,914 B1 | 6/2002 | Troitski | |
| 6,537,937 B1 | 3/2003 | Nishizawa et al. | |
| 6,563,079 B1 | 5/2003 | Umetsu et al. | |
| 6,573,026 B1 | 6/2003 | Aitken et al. | |
| 6,737,345 B1 | 5/2004 | Lin et al. | |
| 6,754,429 B2 | 6/2004 | Borrelli et al. | |
| 6,794,605 B2 | 9/2004 | Park et al. | |
| 6,906,795 B2 | 6/2005 | Goto et al. | |
| 6,990,285 B2 | 1/2006 | Schroeder et al. | |
| 6,992,030 B2 | 1/2006 | Paulson | |
| 7,008,817 B2 | 3/2006 | Kim et al. | |
| 7,019,257 B2 | 3/2006 | Stevens | |
| 7,033,519 B2 | 4/2006 | Taylor et al. | |
| 7,043,072 B2 | 5/2006 | Goto et al. | |
| 7,057,135 B2 | 6/2006 | Li | |
| 7,084,073 B2 | 8/2006 | Lee et al. | |
| 7,211,899 B2 | 5/2007 | Taniguchi et al. | |
| 7,337,540 B2 | 3/2008 | Kurosawa | |
| 7,407,889 B2 | 8/2008 | Tsunetomo et al. | |
| 7,528,967 B2 | 5/2009 | Okawauchi et al. | |
| 7,534,734 B2 | 5/2009 | Ellison | |
| 7,626,665 B2 | 12/2009 | Koike | |
| 7,683,370 B2 | 3/2010 | Kugimiya et al. | |
| 7,749,809 B2 | 7/2010 | How et al. | |
| 7,763,559 B2 | 7/2010 | Kurachi et al. | |
| 7,772,115 B2 | 8/2010 | Hiatt | |
| 7,777,275 B2 | 8/2010 | Lee | |
| 7,836,727 B2 | 11/2010 | Nishiyama | |
| 7,880,117 B2 | 2/2011 | Li et al. | |
| 7,994,503 B2 | 8/2011 | Hino et al. | |
| 8,007,913 B2 | 8/2011 | Coppola et al. | |
| 8,021,950 B1 | 9/2011 | Abadeer et al. | |
| 8,119,462 B2 | 2/2012 | Takasawa et al. | |
| 8,163,649 B2 | 4/2012 | Koike et al. | |
| 8,257,603 B2 | 9/2012 | Logunov et al. | |
| 8,303,754 B2 | 11/2012 | Higuchi | |
| 8,307,672 B2 | 11/2012 | Hidaka et al. | |
| 8,327,666 B2 | 12/2012 | Harvey et al. | |
| 8,338,957 B2 | 12/2012 | Nilsson | |
| 8,341,976 B2 | 1/2013 | Dejneka et al. | |
| 8,384,083 B2 | 2/2013 | Mori et al. | |
| 8,411,459 B2 | 4/2013 | Yu et al. | |
| 8,455,378 B2 | 6/2013 | Yanase et al. | |
| 8,482,189 B2 | 7/2013 | Goto et al. | |
| 8,531,679 B2 | 9/2013 | Scheiner | |
| 8,535,997 B2 | 9/2013 | Kawakami et al. | |
| 8,643,129 B2 | 2/2014 | Laming et al. | |
| 8,670,182 B2 | 3/2014 | Tanida et al. | |
| 8,699,037 B2 | 4/2014 | Cox | |
| 8,742,588 B2 | 6/2014 | Nilsson et al. | |
| 8,796,165 B2 | 8/2014 | Ellison et al. | |
| 8,835,335 B2 | 9/2014 | Murata et al. | |
| 8,871,641 B2 | 10/2014 | Nilsson | |
| 8,873,067 B2 | 10/2014 | Lee et al. | |
| 8,980,727 B1 | 3/2015 | Lei et al. | |
| 8,999,179 B2 | 4/2015 | Yu et al. | |
| 9,023,421 B2 | 5/2015 | Nakashima | |
| 9,024,443 B2 | 5/2015 | Inaba et al. | |
| 9,093,381 B2 | 7/2015 | Barriere et al. | |
| 9,140,539 B2 | 9/2015 | Scheiner | |
| 9,232,652 B2 | 1/2016 | Fushie et al. | |
| 9,263,300 B2 | 2/2016 | Tsai et al. | |
| 9,278,886 B2 | 3/2016 | Boek et al. | |
| 9,296,646 B2 | 3/2016 | Burket et al. | |
| 9,305,470 B2 | 4/2016 | Miki et al. | |
| 9,321,680 B2 | 4/2016 | Chuang et al. | |
| 9,346,706 B2 | 5/2016 | Bazemore et al. | |
| 9,377,583 B2 | 6/2016 | Giaretta et al. | |
| 9,425,125 B2 | 8/2016 | Shen | |
| 9,517,963 B2 | 12/2016 | Marjanovic et al. | |
| 9,676,046 B2 | 6/2017 | Hamada et al. | |
| 9,745,220 B2 | 8/2017 | Burket et al. | |
| 9,758,876 B2 | 9/2017 | Shorey et al. | |
| 9,760,986 B2 | 9/2017 | Ramamurthy et al. | |
| 9,832,868 B1 | 11/2017 | Wright et al. | |
| 9,850,160 B2 | 12/2017 | Marjanovic et al. | |
| 9,953,912 B2 | 4/2018 | Goers | |
| 10,144,093 B2 | 12/2018 | Marjanovic et al. | |
| 10,203,476 B2 | 2/2019 | Cui | |

(56) References Cited

U.S. PATENT DOCUMENTS

| | | |
|---|---|---|
| 2001/0009250 A1 | 7/2001 | Herman et al. |
| 2002/0005805 A1 | 1/2002 | Ogura et al. |
| 2002/0041946 A1 | 4/2002 | Abe |
| 2002/0051563 A1 | 5/2002 | Goto et al. |
| 2002/0062563 A1 | 5/2002 | Koide et al. |
| 2002/0180015 A1 | 12/2002 | Yamaguchi et al. |
| 2003/0007772 A1 | 1/2003 | Borrelli et al. |
| 2003/0045420 A1 | 3/2003 | Koyama et al. |
| 2003/0150839 A1 | 8/2003 | Kobayashi et al. |
| 2003/0206651 A1 | 11/2003 | Goto et al. |
| 2003/0235385 A1 | 12/2003 | Taylor et al. |
| 2004/0013951 A1 | 1/2004 | Wang |
| 2004/0022487 A1 | 2/2004 | Nagasaka et al. |
| 2004/0058476 A1 | 3/2004 | Enquist et al. |
| 2004/0061705 A1 | 4/2004 | Yoon et al. |
| 2004/0092105 A1 | 5/2004 | Lee et al. |
| 2004/0094524 A1 | 5/2004 | Stevens |
| 2004/0152229 A1* | 8/2004 | Najafi ............ B81B 7/007 438/52 |
| 2004/0188393 A1 | 9/2004 | Li et al. |
| 2004/0217455 A1 | 11/2004 | Shiono et al. |
| 2004/0223704 A1 | 11/2004 | Fujii et al. |
| 2004/0256619 A1 | 12/2004 | Nomura et al. |
| 2005/0009315 A1 | 1/2005 | Kim et al. |
| 2005/0029238 A1 | 2/2005 | Chen |
| 2005/0033184 A1 | 2/2005 | Christoph |
| 2005/0079650 A1 | 4/2005 | Mancini et al. |
| 2005/0142364 A1 | 6/2005 | Aitken |
| 2005/0142812 A1 | 6/2005 | Kurosawa |
| 2005/0266320 A1 | 12/2005 | Amemiya |
| 2006/0012766 A1 | 1/2006 | Klosner et al. |
| 2006/0019814 A1 | 1/2006 | Baik et al. |
| 2006/0192978 A1 | 8/2006 | Laguarta et al. |
| 2006/0207976 A1 | 9/2006 | Bovatsek et al. |
| 2006/0219676 A1 | 10/2006 | Taylor et al. |
| 2006/0270232 A1 | 11/2006 | Kawamura et al. |
| 2006/0290232 A1 | 12/2006 | Fujita et al. |
| 2006/0292877 A1 | 12/2006 | Lake |
| 2007/0045779 A1 | 3/2007 | Hiatt |
| 2007/0181543 A1 | 8/2007 | Urairi et al. |
| 2007/0190340 A1 | 8/2007 | Coppola et al. |
| 2007/0232028 A1 | 10/2007 | Lee et al. |
| 2008/0245109 A1 | 10/2008 | Flemming et al. |
| 2008/0314883 A1 | 12/2008 | Juodkazis et al. |
| 2009/0013724 A1 | 1/2009 | Koyo et al. |
| 2009/0029189 A1 | 1/2009 | Moriwaki et al. |
| 2009/0032510 A1 | 2/2009 | Ando et al. |
| 2009/0098351 A1 | 4/2009 | Kishi |
| 2009/0151996 A1 | 6/2009 | Mishima et al. |
| 2010/0000259 A1 | 1/2010 | Ukrainczyk et al. |
| 2010/0050692 A1 | 3/2010 | Logunov et al. |
| 2010/0080961 A1 | 4/2010 | Okamura et al. |
| 2010/0119808 A1 | 5/2010 | Li et al. |
| 2010/0119846 A1 | 5/2010 | Sawada |
| 2010/0133697 A1 | 6/2010 | Nilsson |
| 2010/0206008 A1 | 8/2010 | Harvey et al. |
| 2010/0284027 A1 | 11/2010 | Scheiner |
| 2010/0289115 A1 | 11/2010 | Akiyama et al. |
| 2010/0289186 A1 | 11/2010 | Longo et al. |
| 2010/0292068 A1 | 11/2010 | Takaya et al. |
| 2011/0003619 A1 | 1/2011 | Fujii |
| 2011/0032467 A1 | 2/2011 | Koike |
| 2011/0045239 A1 | 2/2011 | Takaya et al. |
| 2011/0132883 A1 | 6/2011 | Sheng et al. |
| 2011/0187025 A1 | 8/2011 | Costin, Sr. |
| 2011/0195360 A1 | 8/2011 | Flemming et al. |
| 2011/0229687 A1 | 9/2011 | Gu et al. |
| 2011/0248405 A1 | 10/2011 | Li et al. |
| 2011/0256344 A1 | 10/2011 | Ono et al. |
| 2011/0259373 A1 | 10/2011 | Hotta et al. |
| 2011/0300908 A1 | 12/2011 | Grespan et al. |
| 2011/0308942 A1 | 12/2011 | Liu et al. |
| 2011/0318561 A1 | 12/2011 | Murata et al. |
| 2012/0013196 A1 | 1/2012 | Kim et al. |
| 2012/0048604 A1 | 3/2012 | Cornejo et al. |
| 2012/0050692 A1 | 3/2012 | Gollier |
| 2012/0052302 A1 | 3/2012 | Matusick et al. |
| 2012/0092681 A1 | 4/2012 | Cox |
| 2012/0105095 A1 | 5/2012 | Bryant et al. |
| 2012/0111057 A1 | 5/2012 | Barefoot et al. |
| 2012/0125892 A1 | 5/2012 | Shimoi et al. |
| 2012/0125893 A1 | 5/2012 | Shimoi et al. |
| 2012/0129359 A1 | 5/2012 | Shimoi et al. |
| 2012/0131958 A1 | 5/2012 | Shimoi et al. |
| 2012/0135177 A1 | 5/2012 | Cornejo et al. |
| 2012/0135608 A1 | 5/2012 | Shimoi et al. |
| 2012/0135852 A1 | 5/2012 | Ellison et al. |
| 2012/0135853 A1 | 5/2012 | Amin et al. |
| 2012/0141668 A1 | 6/2012 | Nakashima |
| 2012/0142136 A1* | 6/2012 | Horning ............ B81C 1/00301 438/51 |
| 2012/0168412 A1 | 7/2012 | Hooper |
| 2012/0196071 A1 | 8/2012 | Cornejo et al. |
| 2012/0235969 A1 | 9/2012 | Burns et al. |
| 2012/0241919 A1 | 9/2012 | Mitani |
| 2012/0261697 A1 | 10/2012 | Margalit et al. |
| 2012/0276743 A1 | 11/2012 | Won et al. |
| 2012/0308803 A1 | 12/2012 | Dejneka et al. |
| 2013/0034688 A1 | 2/2013 | Koike et al. |
| 2013/0050226 A1 | 2/2013 | Shenoy et al. |
| 2013/0089701 A1 | 4/2013 | Hooper et al. |
| 2013/0105213 A1 | 5/2013 | Hu et al. |
| 2013/0118793 A1 | 5/2013 | Teshima et al. |
| 2013/0135745 A1 | 5/2013 | Tanida et al. |
| 2013/0163801 A1 | 6/2013 | Ha et al. |
| 2013/0205835 A1 | 8/2013 | Giaretta et al. |
| 2013/0209731 A1 | 8/2013 | Nattermann et al. |
| 2013/0210245 A1 | 8/2013 | Jackl |
| 2013/0224492 A1 | 8/2013 | Bookbinder et al. |
| 2013/0228918 A1 | 9/2013 | Chen et al. |
| 2013/0247615 A1 | 9/2013 | Boek et al. |
| 2013/0255779 A1 | 10/2013 | Aitken et al. |
| 2013/0330515 A1 | 12/2013 | Oh et al. |
| 2013/0337599 A1 | 12/2013 | Yun |
| 2014/0034374 A1 | 2/2014 | Cornejo et al. |
| 2014/0054618 A1 | 2/2014 | Li |
| 2014/0116091 A1 | 5/2014 | Chuang et al. |
| 2014/0147623 A1 | 5/2014 | Shorey et al. |
| 2014/0147624 A1 | 5/2014 | Streltsov et al. |
| 2014/0154439 A1 | 6/2014 | Demartino et al. |
| 2014/0166199 A1 | 6/2014 | Bellman et al. |
| 2014/0170378 A1 | 6/2014 | Bellman et al. |
| 2014/0199519 A1 | 7/2014 | Schillinger et al. |
| 2014/0242375 A1 | 8/2014 | Mauro et al. |
| 2014/0254004 A1 | 9/2014 | Wooder et al. |
| 2014/0300728 A1 | 10/2014 | Drescher et al. |
| 2014/0342897 A1 | 11/2014 | Amin et al. |
| 2014/0347083 A1 | 11/2014 | Bryant et al. |
| 2014/0376006 A1 | 12/2014 | Scheiner |
| 2015/0036065 A1 | 2/2015 | Yousefpor et al. |
| 2015/0037553 A1 | 2/2015 | Mauro |
| 2015/0051060 A1 | 2/2015 | Ellison et al. |
| 2015/0054136 A1 | 2/2015 | Ebefors et al. |
| 2015/0060402 A1 | 3/2015 | Burkett et al. |
| 2015/0102498 A1 | 4/2015 | Enicks et al. |
| 2015/0140299 A1 | 5/2015 | Ellison et al. |
| 2015/0166393 A1 | 6/2015 | Marjanovic et al. |
| 2015/0166395 A1 | 6/2015 | Marjanovic et al. |
| 2015/0166396 A1 | 6/2015 | Marjanovic et al. |
| 2015/0173191 A1 | 6/2015 | Takahashi |
| 2015/0274583 A1 | 10/2015 | An et al. |
| 2015/0306847 A1 | 10/2015 | Bellman et al. |
| 2015/0329415 A1 | 11/2015 | Bellman et al. |
| 2015/0368145 A1 | 12/2015 | Senshu et al. |
| 2015/0376050 A1 | 12/2015 | Nakamura et al. |
| 2016/0026842 A1 | 1/2016 | Withers et al. |
| 2016/0102009 A1 | 4/2016 | Boek et al. |
| 2016/0107925 A1 | 4/2016 | Burket et al. |
| 2016/0166395 A9 | 6/2016 | Weiman |
| 2016/0199944 A1 | 7/2016 | Hosseini |
| 2016/0201474 A1 | 7/2016 | Slavens et al. |
| 2016/0204126 A1 | 7/2016 | Amano |
| 2016/0208387 A1 | 7/2016 | Liu et al. |
| 2016/0219704 A1 | 7/2016 | Vandemeer et al. |

(56) References Cited

U.S. PATENT DOCUMENTS

| | | |
|---|---|---|
| 2016/0237571 A1 | 8/2016 | Liu et al. |
| 2016/0282584 A1 | 9/2016 | Cui |
| 2016/0305764 A1 | 10/2016 | Cui et al. |
| 2016/0312365 A1 | 10/2016 | Cordonier et al. |
| 2016/0327744 A1 | 11/2016 | Giaretta et al. |
| 2016/0334203 A1 | 11/2016 | Cui et al. |
| 2016/0351410 A1 | 12/2016 | Fu et al. |
| 2016/0352023 A1* | 12/2016 | Dang ............... H01Q 21/0075 |
| 2016/0368100 A1 | 12/2016 | Marjanovic et al. |
| 2017/0008122 A1 | 1/2017 | Wieland et al. |
| 2017/0011914 A1* | 1/2017 | Sumant ............ H01L 21/02527 |
| 2017/0036419 A1 | 2/2017 | Adib et al. |
| 2017/0103249 A1 | 4/2017 | Jin et al. |
| 2017/0160077 A1 | 6/2017 | Featherstone et al. |
| 2017/0228884 A1 | 8/2017 | Yoshida |
| 2017/0252859 A1 | 9/2017 | Kumkar et al. |
| 2017/0276951 A1 | 9/2017 | Kumkar et al. |
| 2017/0363417 A1 | 12/2017 | Cui et al. |
| 2018/0005922 A1 | 1/2018 | Levesque, Jr. et al. |
| 2018/0057390 A1 | 3/2018 | Hackert et al. |
| 2018/0062342 A1 | 3/2018 | Comstock, II et al. |
| 2018/0068868 A1 | 3/2018 | Jaramillo et al. |
| 2018/0093914 A1 | 4/2018 | Akarapu et al. |
| 2018/0215647 A1 | 8/2018 | Ortner et al. |
| 2018/0342451 A1 | 11/2018 | Dahlberg et al. |
| 2019/0185373 A1 | 6/2019 | Hu et al. |

FOREIGN PATENT DOCUMENTS

| | | |
|---|---|---|
| CN | 1761378 A | 4/2006 |
| CN | 1845812 A | 10/2006 |
| CN | 101238572 A | 8/2008 |
| CN | 101427427 A | 5/2009 |
| CN | 100494879 C | 6/2009 |
| CN | 101722367 A | 6/2010 |
| CN | 102246292 A | 11/2011 |
| CN | 102319960 A | 1/2012 |
| CN | 102485405 A | 6/2012 |
| CN | 102795596 A | 11/2012 |
| CN | 103534216 A | 1/2014 |
| CN | 102300820 B | 2/2014 |
| CN | 102958642 B | 7/2015 |
| CN | 104897062 A | 9/2015 |
| DE | 102010003817 A1 | 10/2011 |
| EP | 247993 A1 | 12/1987 |
| EP | 280918 A2 | 9/1988 |
| EP | 1164113 A1 | 12/2001 |
| EP | 1714730 A1 | 10/2006 |
| EP | 1990125 A1 | 11/2008 |
| EP | 2020273 A1 | 2/2009 |
| EP | 2253414 A1 | 11/2010 |
| EP | 2600397 A1 | 6/2013 |
| EP | 3166372 A1 | 5/2017 |
| IN | 201102390 I1 | 3/2013 |
| JP | 55130839 A | 10/1980 |
| JP | 56160893 A | 12/1981 |
| JP | 03252384 A | 11/1991 |
| JP | 06079486 A | 3/1994 |
| JP | 10263873 A | 10/1998 |
| JP | 11297703 A | 10/1999 |
| JP | 2000301372 A | 10/2000 |
| JP | 2002028799 A | 1/2002 |
| JP | 2002154846 A | 5/2002 |
| JP | 2003017503 A | 1/2003 |
| JP | 2003148931 A | 5/2003 |
| JP | 2004190043 A | 7/2004 |
| JP | 2004330236 A | 11/2004 |
| JP | 2004363212 A | 12/2004 |
| JP | 2005257339 A | 9/2005 |
| JP | 2006161124 A | 6/2006 |
| JP | 2006290630 A | 10/2006 |
| JP | 2007042741 A | 2/2007 |
| JP | 2007067031 A | 3/2007 |
| JP | 2008156200 A | 7/2008 |
| JP | 2008288577 A | 11/2008 |
| JP | 4349132 B2 | 10/2009 |
| JP | 2010074017 A | 4/2010 |
| JP | 4672689 B2 | 4/2011 |
| JP | 2011143434 A | 7/2011 |
| JP | 2011178642 A | 9/2011 |
| JP | 2011228517 A | 11/2011 |
| JP | 2011251872 A | 12/2011 |
| JP | 2012028533 A | 2/2012 |
| JP | 2013220958 A | 10/2013 |
| JP | 2015146410 A | 8/2015 |
| KR | 1020020038707 A | 5/2002 |
| KR | 20110046953 A | 5/2011 |
| KR | 1159697 B1 | 6/2012 |
| TW | 201041118 A | 11/2010 |
| TW | 201212755 A | 3/2012 |
| WO | 8902877 A1 | 4/1989 |
| WO | 2001033621 A2 | 5/2001 |
| WO | 03021004 A1 | 3/2003 |
| WO | 2005031300 A2 | 4/2005 |
| WO | 2005033033 A1 | 4/2005 |
| WO | 2005034594 A1 | 4/2005 |
| WO | 2006112822 A1 | 10/2006 |
| WO | 2007096958 A1 | 8/2007 |
| WO | 2008110061 A1 | 9/2008 |
| WO | 2009072810 A2 | 6/2009 |
| WO | 2010087483 A1 | 8/2010 |
| WO | 2011109648 A1 | 9/2011 |
| WO | 2012011230 A1 | 1/2012 |
| WO | 2012060277 A1 | 5/2012 |
| WO | 2013008344 A1 | 1/2013 |
| WO | 2013030848 A1 | 3/2013 |
| WO | 2013130718 A1 | 9/2013 |
| WO | 2014038326 A1 | 3/2014 |
| WO | 2014085663 A1 | 6/2014 |
| WO | 2014148020 A1 | 9/2014 |
| WO | 2014205301 A2 | 12/2014 |
| WO | 2015113023 A1 | 7/2015 |
| WO | 2015157202 A1 | 10/2015 |
| WO | 2016010954 A2 | 1/2016 |
| WO | 2016089844 A1 | 6/2016 |
| WO | 2016118683 A1 | 7/2016 |
| WO | 2016176171 A1 | 11/2016 |
| WO | 2017038075 A1 | 3/2017 |
| WO | 2017062798 A1 | 4/2017 |
| WO | 2018162385 A1 | 9/2018 |

OTHER PUBLICATIONS

Benjamin et al; "The Adhesion of Evaporated Metal Films on Glass"; Proc. Roy. Soc. A., vol. 261, (1962); pp. 516-531.

Borghi et al; "M2 Factor of Bessel-Gauss Beams"; Optics Letters; vol. 22, No. 5; (1997) pp. 262-264.

Chen et al "Development of an AOI system for chips with a hole on backside based on a frame imager" Proc. of SPIE vol. 9903, 2016. 6 pgs.

Chen et al. "Projection ablation of glass-based single and arrayed microstructures using excimer laser", (2005) Optics and Laser Technology 37, 271-280.

Corning, "Properties of VYCOR Code 7913 96% Silica High Temperature Glass," Apr. 2014.

Iijima et al; "Resistivity Reduction by External Oxidation of Cu—Mn Alloy Films for Semiconductor Interconnect Application"; Journal of Vacuum Science & Technology B: Microelectronics and Nanometer Structures Processing, Measurement, and Phenomena, 27, 1963-1968 (2009.

Integrace, "Borosilicate glass: technical glass by Pulles & Hanique: Duran & Pyrex," Pulles & Hanique B.V., 2 pgs. Published Mar. 15, 2012, retrieved from: https://web.archive.org/web/20120315092729/http://www.pulleshanique.com/02_borosilicate-glass.htm.

Kiyama et al; "Examination of Etching Agent and Etching Mechanism on Femtosecond Laser Microfabrication of Channels Inside Vitreous Silica Substrates"; J. Phys. Chem. C, 2009, 113, pp. 11560-11566.

Koike et al; "P-33: Cu—Mn Electrodes for a-Si TFT and Its Electrical Characteristics"; SID Symposium Digest of Technical Papers, 41:1, 1343-1346 (2010.

(56) References Cited

OTHER PUBLICATIONS

Koike et al; "Self-Forming Diffusion Barrier Layer in Cu—Mn Alloy Metallization"; Appl. Phys. Lett. 87, 041911-1-041911-3 (2005.
Koyama et al. "Laser-micromachining for Ag Ion Exchanged Glasses," Second International Symposium on Laser Precision Microfabrication, Proc. SPE vol. 4426 (2002) 162-165.
Kruger et al "UV laser drilling of SiC for semiconductor device fabrication," J. Physics:Conference Series 59 (2007) 740-744.
Li et al. "Thick Polymer cover layers for laser micromachining of fine holes," Applied Physics A, Sep. 2005, vol. 81, Issues 4, pp. 753-758.
Madehow.com, Liquid Crystal Display (LCD), Jan. 29, 2006, https:/fweb.archive.org/web/20060129092154/http://www.madehow.com/Volume-1/Liquid-Crystal-Display-LCD.html; pp. 1-6.
Matsusaka et al. "Micro-machinability of silversodium ion-exchanged glass by UV nanosecond laser," J. Materials Processing Technology 202 (2008) 514-520.
Microchemicals, "Silicon Wafers, Quartz Wafers, Glass Wafers," Product Specifications: Brochure. 2014, 28 pgs.
Mukhina L; "Laser Pulse Damage on the Surface of Ion Exchange Treated Glass"; Soviet Journal of Glass Physics and Chemistry; vol. 19; No. 3; pp. 269-272; (1993.
Ogutu et al; "Superconformal Filling of High Aspect Ratio Through Glass Vias (TGV) for Interposer Applications Using TNBT and NTBC Additives"; Journal of the Electrochemical Society, 162 (9), D457-D464 (2015.
Yun et al; "P-23:The Contact Properties and TFT Structures of A-IGZO TFTs Combined With Cu—Mn Alloy Electrodes"; SID Symposium Digest of Technical Papers 42:1, 1177-1180 (2011).
Ramil et al "Micromachining of glass by the third harmonic of nanosecond Nd:YVO4 laser", Applied Surface Science 255 (2009) pp. 5557-5560.
Shorey et al; "Progress and Application of Through Glass Via (TGV) Technology"; 2016 Pan Pacific Microelectronis Symposium, SMTA, Jan. 25, 2016; pp. 1-6.
Shorey; "Leveraging Glass for Advanced Packaging and IoT"; Apr. 21, 2016, Retrieved Form the Internet: URL:http://www.corning.com/media/worldwide/cdt/documents/iMAPs%20-%20Corning%20Overview%20-%204-21-16%20FINALpptx.pdf.
Siegman; "New Development in Laser Resonators"; SPIE, vol. 1227, Optical Resonators (1990) pp. 2-14.
Swift Glass, "Quartz/Fused Silica," Mar. 2016.
Thiele; "Relation Between Catalytic Activity and Size of Particle"; Industrial and Engineering Chemistry, vol. 31, No. 7; (1939) pp. 916-920.
Topper et al; "3-D Thin Film Interposer Based on TGV (Through Glass Vias): an Alternative to Si-Interposer"; IEEE, Electronic Components and Technology Conference; 2010; pp. 66-73.
Tsai et al. "Investigation of underwater laser drilling for brittle substrates," J. Materials Processing technology 209 (2009) 2838-2846.
U.S. Appl. No. 62/846,059; Cai et al. "Silicate Glass Compositions Useful for the Efficient Production of Through Glass Vias", filed May 10, 2019, 43 pgs.
U.S. Appl. No. 62/846,102; Guo et al. "High Silicate Glass Articles Possessing Through Glass Vias and Methods of Making and Using Thereof", filed May 10, 2019, 36 pgs.
Uzgiris et al. "Etched Laser Filament Tracks in Glasses and Polymers", (1973) Phys. Rev. A 7, 734-740.
Wakayama et al. "Small size probe for inner profile measurement of pipes using optical fiber ring beam device" Proc. of SPIE vol. 8563, 2012. 7 pgs.
Wlodarczyk et al "The Impact of Graphite Coating and Wavelength on Picosecond Laser Machining of Optical Glasses,", 31st ICALEO Program Notes (2012). Paper M#309.
Wu et al, "A Study on Annealing Mechanisms With Different Manganese Contents in CuMn Alloy"; Journal of Alloys and Compounds, vol. 542, 2012, pp. 118-123.
Zavyalov; "3D Hole Inspection Using Lens With High Field Curvature"; Measurement Science Review; vol. 15, No. 1; 2015; pp. 52-57.
ASTM standard C770-16, entitled "Standard Test Method for Measurement of Glass Stress-Optical Coefficient," (2017).
Chinese Second Office Action CN201380071736.1 dated Mar. 7, 2017.
Handbook of Adhesives (3rd edition, Edited by Irving Skeist)
Miranda et al. (Ultraviolet-induced crosslinking of poly(vinyl alcohol) evaluated by principal component analysis of FTIR spectra,Polym Int 50:1068-1072(2001).
Polavka et al. (Crosslinking of polymers by the effect of ultraviolet radiation crosslinking of poly(vinyl alcohol) in the presence ofterephthalic aldehyde, 1980).
Tom Christiansen, Tami Erickson; Standard Operating Procedure: Spin-On-Glass, Surface Level Characterization (2000).

* cited by examiner

INORGANIC WAFER HAVING THROUGH-HOLES ATTACHED TO SEMICONDUCTOR WAFER

CROSS-REFERENCE TO RELATED APPLICATIONS

This application is a divisional of U.S. application Ser. No. 15/630,363 filed Jun. 22, 2017, which claims the benefit of priority under 35 U.S.C. § 119 of U.S. Provisional Application Ser. No. 62/356,067 filed on Jun. 29, 2016, the content of which is relied upon and incorporated herein by reference in its entirety.

BACKGROUND

Field

The present disclosure relates to bonded wafers, articles including such wafers, and related processes.

Background

There is an increasing interest in developing new substrate architectures in the semiconductor industry. One objective is to achieve more functionalities out of devices and packaging without incurring additional cost. Existing substrate architectures, such as silicon-on-insulator (SOI), have drawbacks, including limited thickness of the insulating layer and high cost.

BRIEF SUMMARY

The present disclosure is directed to articles comprising a semiconductor wafer bonded to an inorganic wafer having a hole through the inorganic wafer, and methods of making such articles.

In an aspect (1), a process comprises forming a damage track in an inorganic wafer bonded to a semiconductor wafer using a laser that emits a wavelength of light wherein the semiconductor is opaque to the wavelength of light and the inorganic wafer is transparent to the wavelength of light and enlarging the damage track in the inorganic wafer to form a hole through the inorganic wafer by etching, and the hole terminates at an interface between the semiconductor wafer and the inorganic wafer.

An aspect (2) according to the aspect (1), wherein the semiconductor wafer is a bare semiconductor wafer.

An aspect (3) according to any preceding aspect, wherein the semiconductor wafer may be a silicon wafer.

An aspect (4) according to any preceding aspect, wherein the etching is performed with an etchant that etches the inorganic wafer at a first rate and the semiconductor wafer at a second rate, and the first rate is at least 10 times the second rate, such as 10 times the second rate, 20 times the second rate, 50 times the second rate, 100 times the second rate, 200 times the second rate, 500 times the second rate, 1,000 times the second rate, 5,000 times the second rate, 10,000 times the second rate, 100,000 times the second rate, any range bounded on the lower end by any of these values, or any range defined by any two of these values.

An aspect (5) according to any preceding aspect, wherein the inorganic wafer has a resistivity of at least $10^5$ Ω-m at room temperature and a breakdown voltage of at least 1 kV for the thickness of 0.5 mm at room temperature. The resistivity of the inorganic wafer may be $10^5$ Ω-m, $10^6$ Ω-m, $10^7$ Ω-m, $10^8$ Ω-m, $10^9$ Ω-m, $10^{10}$ Ω-m, $10^{11}$ Ω-m, $10^{12}$ Ω-m, $10^{13}$ Ω-m, $10^{14}$ Ω-m, $10^{15}$ Ω-m, $10^{16}$ Ω-m, $10^{17}$ Ω-m, $10^{18}$ Ω-m, $10^{19}$ Ω-m, $10^{20}$ Ω-m, $10^{21}$ Ω-m, $10^{22}$ Ω-m at room temperature, any range bounded on the lower end by any of these values, or in any range defined by any two of these values. The breakdown voltage of the inorganic wafer may be 1 kV, 5 kV, 10 kV, 20 kV, 50 kV, 100 kV, 200 kV, 500 kV for the thickness of 0.5 mm at room temperature, any range bounded on the lower end by any of these values, or in any range defined by any two of these values.

An aspect (6) according to any preceding aspect, wherein the inorganic wafer may be alumino-borosilicate glass, fused silica, or sapphire.

An aspect (7) according to any preceding aspect, wherein the thickness of the inorganic wafer is from 10 μm to 1 mm.

An aspect (8) according to aspect (7), wherein the thickness may be from 50 μm to 250 μm, such as from 50 μm to 100 μm.

An aspect (9) according to any preceding aspect, wherein the damage track terminates at the interface between the semiconductor and inorganic wafers.

An aspect (10) according to any preceding aspect, wherein the damage track terminates within the inorganic wafer before reaching the interface.

An aspect (11) according to any preceding aspect, wherein the laser is sent through optics that create an extended focus, and the extended focus forms the damage track in the inorganic wafer.

An aspect (12) according to aspect (11), wherein the extended focus is a focal line or a plurality focal points along the beam propagation direction and occurring within the inorganic wafer.

An aspect (13) according to aspect (12), wherein the semiconductor wafer is sufficiently opaque to the wavelength of light emitted by the laser to disrupt the extended focus.

An aspect (14) according to any preceding aspect, wherein the laser may be a short pulse laser.

An aspect (15) according to aspect (14), wherein the laser may be a burst pulse laser.

An aspect (16) according to any preceding aspect, wherein the wavelength of light may be 257 nm, 266 nm, 343 nm, 355 nm, 515 nm, 530 nm, 532 nm, 1030 nm, or 1064 nm.

An aspect (17) according to any preceding aspect, further comprising bonding the semiconductor wafer to the inorganic wafer by anodic bonding.

An aspect (18) according to any of aspects (1) to (17), further comprising bonding the semiconductor wafer to the inorganic wafer, wherein bonding comprises forming a surface modification layer to at least one of the semiconductor wafer and the inorganic wafer.

An aspect (19) according to any preceding aspect, wherein the process further comprises metalizing the hole.

An aspect (20) according to any preceding aspect, wherein a diameter of the hole at a surface of the inorganic wafer opposite the interface is from 4 μm to 100 μm.

An aspect (21) according to any preceding aspect, wherein the average surface roughness (Ra) of the inorganic wafer at the interface is less than 1 nm.

In some embodiments, an article is formed by any of the processes described herein.

In an aspect (22), an article comprises a semiconductor wafer bonded to an inorganic wafer, wherein the semiconductor wafer is opaque to a wavelength of light to which the inorganic wafer is transparent and the inorganic wafer has a hole formed through the inorganic wafer, the hole terminates at an interface between the semiconductor wafer and the inorganic wafer.

An aspect (23) according to aspect (22), wherein the semiconductor wafer is a bare semiconductor wafer.

An aspect (24) according to aspect (22) or (23), wherein the semiconductor wafer may be a silicon wafer.

An aspect (25) according to any one of aspects (22) to (24), wherein the inorganic wafer has a resistivity of at least $10^5$ Ω-m at room temperature and a breakdown voltage of at least 1 kV for the thickness of 0.5 mm at room temperature. The resistivity of the inorganic wafer may be $10^5$ Ω-m, $10^6$ Ω-m, $10^7$ Ω-m, $10^8$ Ω-m, $10^9$ Ω-m, $10^{10}$ Ω-m, $10^{11}$ Ω-m, $10^{12}$ Ω-m, $10^{13}$ Ω-m, $10^{14}$ Ω-m, $10^{15}$ Ω-m, $10^{16}$ Ω-m, $10^{17}$ Ω-m, $10^{18}$ Ω-m, $10^{19}$ Ω-m, $10^{20}$ Ω-m, $10^{21}$ Ω-m, $10^{22}$ Ω-m at room temperature, any range bounded on the lower end by any of these values, or in any range defined by any two of these values. The breakdown voltage of the inorganic wafer may be 1 kV, 5 kV, 10 kV, 20 kV, 50 kV, 100 kV, 200 kV, 500 kV for the thickness of 0.5 mm at room temperature, any range bounded on the lower end by any of these values, or in any range defined by any two of these values.

An aspect (26) according to any one of aspects (22) to (25), wherein the inorganic wafer may be alumino-borosilicate glass, fused silica, or sapphire.

An aspect (27) according to any one of aspects (22) to (26), wherein the thickness of the inorganic wafer is from 10 μm to 1 mm.

An aspect (28) according to aspect (27), wherein the thickness of the inorganic wafer is such as from 50 μm to 250 μm, or from 50 μm to 100 μm.

An aspect (29) according to any of aspects (22) to (28), wherein the hole is metalized.

An aspect (30) according to any one of aspects (22) to (29), wherein diameter of the hole at a surface of the inorganic wafer opposite the interface is from 4 μm to 100 μm.

An aspect (31) according to any one of aspects (22) to (30), wherein the average surface roughness (Ra) of the inorganic wafer at the interface is less than 1 nm.

An aspect (32) according to any one of aspects (22) to (31), wherein the semiconductor wafer is removably bonded to the inorganic wafer.

In an aspect (33) a device comprises a semiconductor wafer bonded to an inorganic wafer and one or more device components formed on at least one of the semiconductor wafer and the inorganic wafer, the semiconductor wafer is opaque to a wavelength of light to which the inorganic wafer is transparent, and the inorganic wafer has a first hole formed therethrough and terminating at an interface between the semiconductor wafer and the inorganic wafer.

An aspect (34) according to aspect (33), wherein the first hole is metalized.

An aspect (35) according to aspect (33) or (34), wherein each of the one or more device components is selected from the group consisting of a microelectronic device component, a radio-frequency (RF) device component, an optoelectronic device component, a microelectromechanical system (MEMS) device component, and a biosensor device component.

An aspect (36) according to any one of aspects (33) to (35), wherein the semiconductor wafer has a second hole formed therethrough and aligned with the first hole at the interface between the semiconductor wafer and the inorganic wafer.

An aspect (37) according to aspect (36), wherein the one or more device components are formed on both the semiconductor wafer and the inorganic wafer.

An aspect (38) according to aspect (37), wherein the one or more device components formed on the semiconductor wafer and the one or more device components formed on the inorganic wafer are connected to one another via the first and second holes.

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments. In the drawings, like reference numbers indicate identical or functionally similar elements.

DETAILED DESCRIPTION

Figure 1:
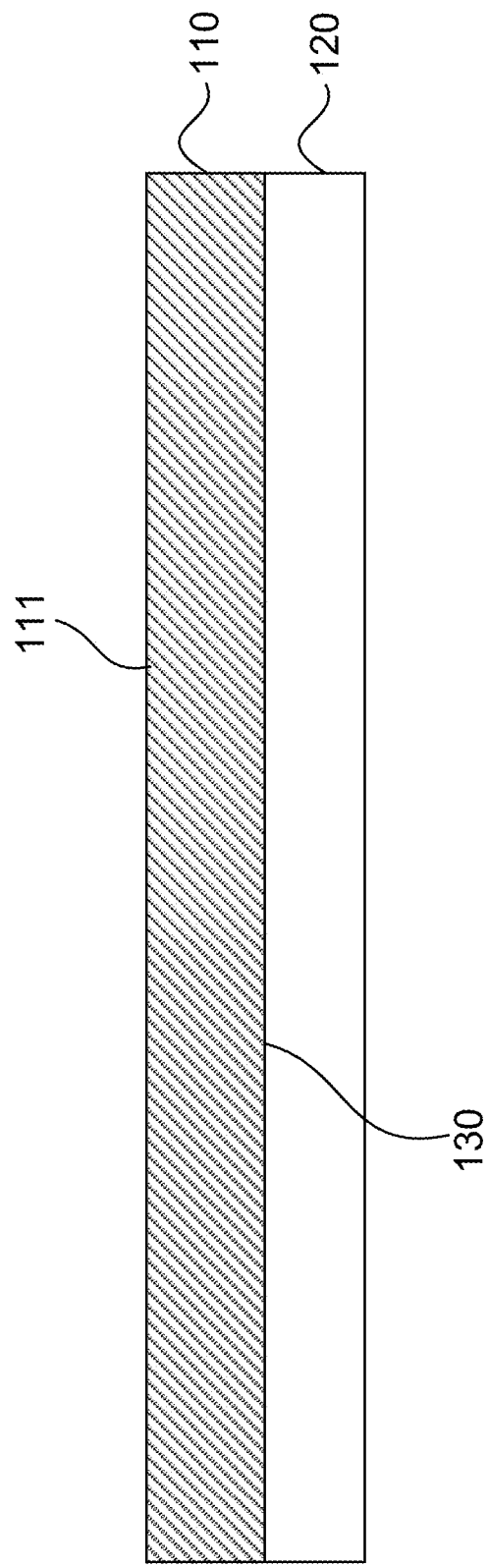
FIG. 1 illustrates bonding a semiconductor wafer to an inorganic wafer.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. Regardless of whether a numerical value or end-point of a range recites "about," the numerical value or end-point of a range is intended to include two embodiments: one modified by "about," and one not modified by "about."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The term "or," as used herein, is inclusive; more specifically, the phrase "A or B" means "A, B, or both A and B." Exclusive "or" is designated herein by terms such as "either A or B" and "one of A or B," for example.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

The term "wherein" is used as an open-ended transitional phrase, to introduce a recitation of a series of characteristics of the structure.

As used herein, "comprising" is an open-ended transitional phrase. A list of elements following the transitional phrase "comprising" is a non-exclusive list, such that elements in addition to those specifically recited in the list may also be present.

As the semiconductor industry looks to find new ways to extend Moore's Law, there is an increasing interest in finding novel device and packaging solutions. The objective is to achieve more functionalities out of devices and packaging without incurring additional cost. This has led to development of solutions in 2.5D and 3D interposer technology in silicon substrates, organic substrates and glass substrates. For instance, SOI technology uses of a layered silicon-insulator-silicon substrate in place of conventional silicon substrates in semiconductor manufacturing. However, the insulator layers in SOI wafers are usually formed by ion implantation or surface oxidation and are very thin, e.g. usually less than 1 μm. Another related technology is silicon on sapphire (SOS) technology, where a thin layer of silicon is typically grown on a sapphire wafer. However, this technology suffers from challenges in defect formation resulting from the differences in the crystal lattice structure of silicon and sapphire. Moreover, both SOI and SOS technologies involve complex processes, which yield high cost of the resultant wafers.

In some embodiments, a process uses wafer bonding technology and leverages through-hole manufacturing process to provide a new substrate architecture. The result is a bonded substrate with holes in an inorganic wafer, e.g., a glass substrate, in any desired pattern, thereby providing an advantaged and flexible platform on which a variety of devices, e.g., microelectronic devices, optoelectronic devices, RF-devices, and microelectronic mechanical system (MEMS) devices, can be fabricated. Compared with SOI and SOS technologies, the process described herein can create an article having a much thicker (e.g. 100 μm) insulating layer. Furthermore, processes described herein can create not just an insulating layer, but also an interposer for physical, optical, and/or electrical connection to other devices formed utilizing the semiconductor wafer. For instance, processes described herein can utilize laser drilling and chemical etching techniques to selectively create vertical interconnect accesses (vias) in a glass wafer in a manner that does not substantially penetrate the silicon wafer bonded to the glass wafer. The additional thickness provides more electrical isolation than the thin SOI layer, and the vias provide physical, electrical, and/or optical interconnects depending on the applications, while avoiding the high cost of SOI and SOS technologies.

Additional novel features will be set forth in part in the description which follows, and in part will become apparent to those skilled in the art upon examination of the following and the accompanying drawings or may be learned by production or operation of the examples. The novel features of the present disclosure may be realized and attained by practice or use of various aspects of the methodologies, instrumentalities, and combinations set forth in the detailed examples discussed below.

In some embodiments, a semiconductor wafer may be bonded to an inorganic wafer to form a bonded substrate. As used herein, "wafer" refers to a physical object that is the basic work piece transformed by various process operations into the desired configuration. A "wafer" may also be referred to as a "substrate" in the present disclosure. In some embodiments, FIG. 1 illustrates bonding a semiconductor wafer 110 to an inorganic wafer 120. Semiconductor wafer 110 may be any wafer made of a semiconductor material in the crystalline, amorphous, or alloy form, including elemental semiconductors, such as silicon (Si) or germanium (Ge), compound semiconductors, such as gallium arsenide (GaAs), silicon carbide (SiC), silicon nitride (SiN), indium gallium arsenide (InGaAs), or indium gallium zinc oxide (IGZO), and organic semiconductors, such as phenyl-C61-butyric acid methyl ester (PCBM), to name a few. Depending on the material, form, and/or size of semiconductor wafer 110, the thickness of semiconductor wafer 110 may vary from 100 μm to 1 mm.

In some embodiments, semiconductor wafer 110 is a bare semiconductor wafer. That is, there is no device component that has been made on or in semiconductor wafer 110 prior to the bonding. So, article 100 of FIG. 3 or FIG. 4 may be fabricated without any device components present. Device components may be subsequently added.

Figure 3:
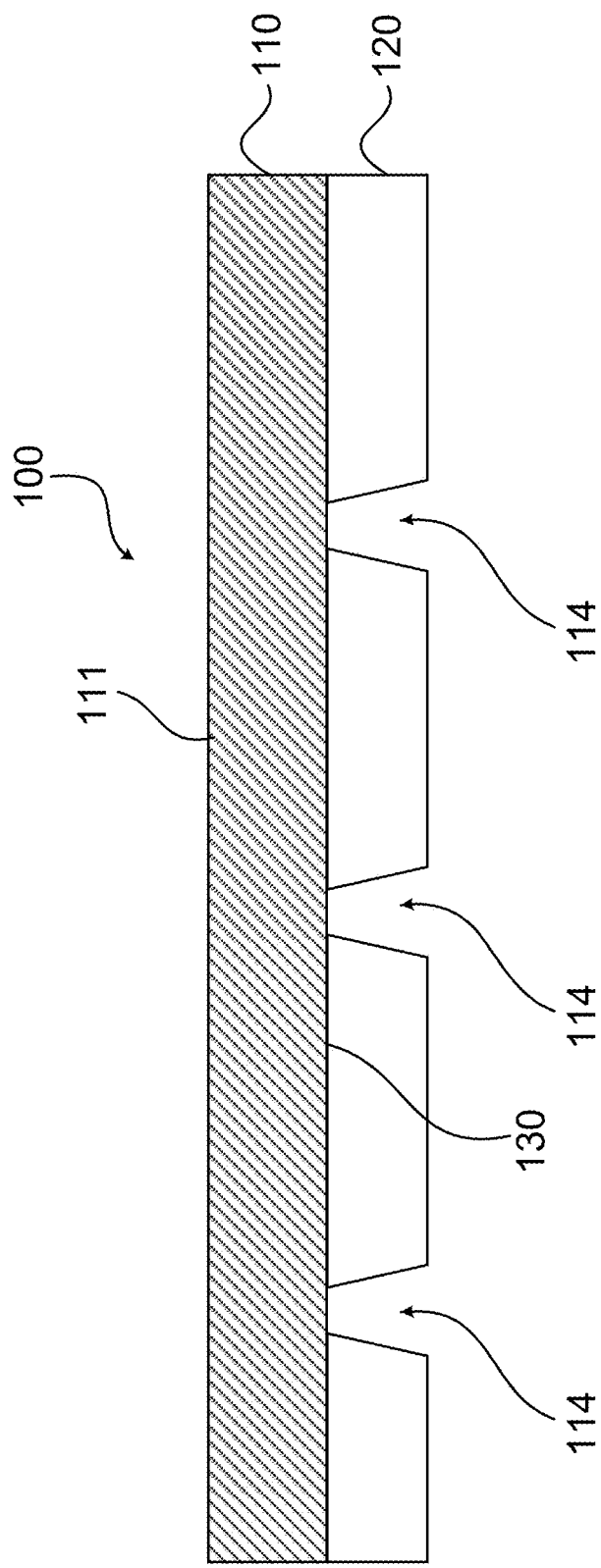
FIG. 3 illustrates enlarging the damage tracks of FIG. 2 to form holes through the inorganic wafer.
Figure 4:
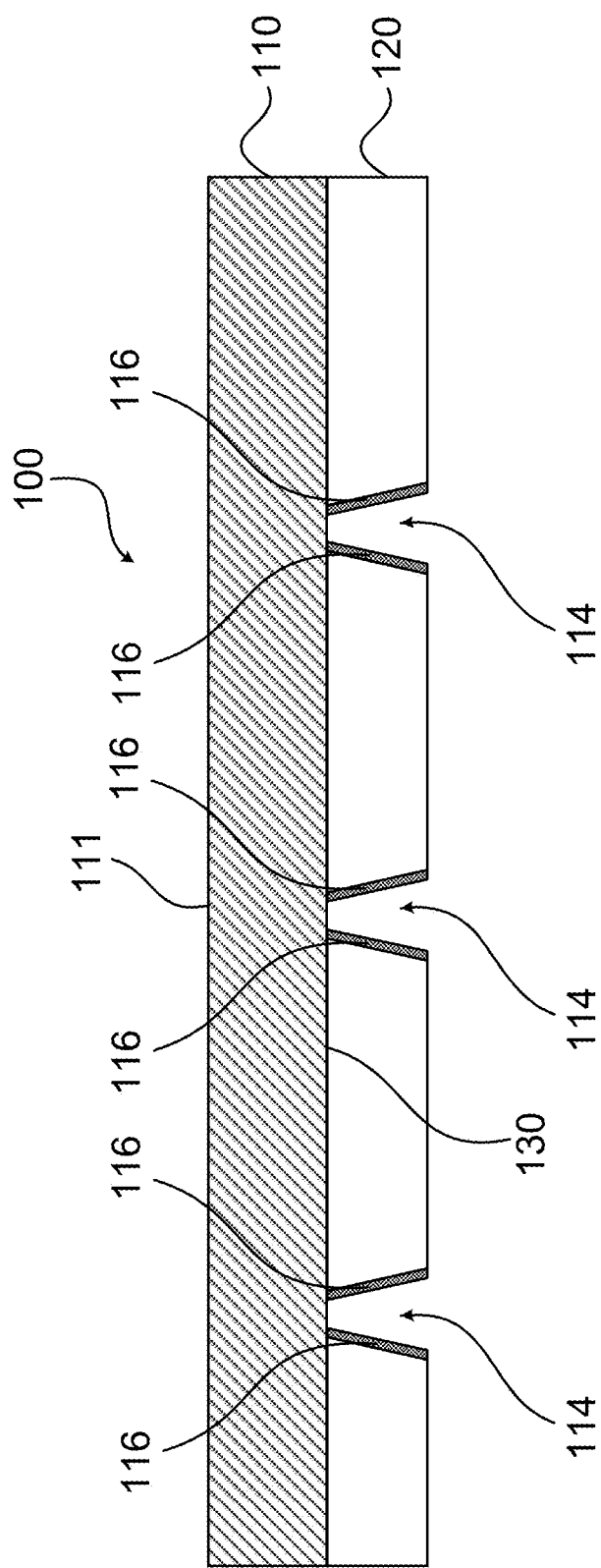
FIG. 4 illustrates metalizing the holes of FIG. 3.

Device components may be added to article 100 after semiconductor wafer 110 is bonded to inorganic wafer 120, for example to article 100 as illustrated in FIGS. 3 and 4. Or, device components may be present on article 100 before semiconductor wafer 110 is bonded to inorganic wafer 120. Such device components may include, for example, active microelectronic device components (e.g. diodes, junctions, transistors, etc.) passive microelectronic device components (e.g. resistors, capacitors, etc.), radio-frequency (RF) device components (e.g. transmission lines, resonators, etc.), optoelectronic device components (e.g. waveguides, lenses, mirrors, etc.), MEMS device (e.g. diaphragms, cantilevers, cavities, etc.), or biosensor devices (e.g. arrays of holes in glass with semiconductor circuits attached to the holes, electrical impedance change sensors for cell based assays, etc.). Where device components are added to article 100 as it appears, for example, in FIG. 4, one way to add and electrically connect the device components is to form vias in semiconductor wafer 110 that electrically connect conductive material 116 to surface 111 of semiconductor wafer 110, which is exposed and may be subject to a variety of semiconductor processing techniques. Device components may be fabricated on surface 111 using any suitable semiconductor processing technique.

In some embodiments, semiconductor wafer 110 is opaque to one or more wavelengths of light. The light may be emitted by a laser, such as a Nd:YAG, Nd:YVO4, Yb:KGW, or Ti:sapphire laser, and the wavelengths to which semiconductor wafer 110 is opaque may be the lasers' fundamental wavelengths or harmonics, including for example, 257 nm, 266 nm, 343 nm, 355 nm, 515 nm, 530 nm, 532 nm, 1030 nm, and 1064 nm. As described below in detail, the opaqueness of semiconductor wafer 110 to certain wavelengths of a laser beam can ensure the selectivity of the laser drilling technology so that the laser beam to be applied to inorganic wafer 120 would not substantially affect semiconductor wafer 110. In other words, interface 130 acts as a stop to laser drilling through inorganic wafer 120. Interface 130 is where bonded semiconductor wafer 110 and inorganic wafer 120 meet.

Inorganic wafer 120 may be any wafer made of an inorganic material, including glass, such as alumino-borosilicate glass, fused silica, and sapphire, to name a few. The alumino-borosilicate glass may include alkali-free glass such as Corning EAGLE XG® glass, Corning Lotus™ glass, Corning Willow® glass, or Corning Iris™ glass, and ion exchangeable alkali-containing glasses. As used here, "alkali-free glass" means that alkali metal was not purposefully added to the composition of the glass, and is not present in more than trace amounts that do not significantly affect material properties of the glass. In some embodiments, inorganic wafer 120 is substantially thicker than the oxide layer of a standard SOI wafer (e.g., less than 1 µm). In some embodiments, the thickness of inorganic wafer 120 is at least 5 µm, such as from 10 µm to 1 mm, preferably from 50 µm to 250 µm, or from 50 µm to 100 µm, for example, 50 µm, 60 µm, 70 µm, 80 µm, 90, µm, 100 µm, 110 µm, 120 µm, 130 µm, 140 µm, 150 µm, 160 µm, 170 µm, 180 µm, 190 µm, 200 µm, 210 µm, 220 µm, 230 µm, 240 µm, 250 µm, or any range defined by any two of these values. In some embodiments, the thickness of inorganic wafer 120 is less than 100 µm, which is difficult to have holes drilled through rapidly by known solutions. In the present disclosure, as inorganic wafer 120 is bonded to semiconductor wafer 110 prior to making holes in inorganic wafer 120. Advantageously, it is easier to handle inorganic wafer 120 that is less than 100 µm thickness with such bonding, compared to known methods for handling wafers less than 100 µm thick. For example, the thickness of inorganic wafer 120 may be from 10 µm to 100 µm, such as 10 µm, 20 µm, 30 µm, 40 µm, 50 µm, 60 µm, 70 µm, 80 µm, 90 µm, or 100 µm, or any range defined by any two of these values.

In some embodiments, inorganic wafer 120 is transparent to one or more wavelengths of light. As described above, the light may be emitted by a laser, such as a Nd:YAG, Nd:YVO4, Yb:KGW, or Ti:sapphire laser, and the wavelengths to which inorganic wafer 120 is transparent may be the lasers' fundamental wavelengths or harmonics, including for example, 257 nm, 266 nm, 343 nm, 355 nm, 515 nm, 530 nm, 532 nm, 1030 nm, and 1064 nm. As described below in detail, the transparency of inorganic wafer 120 to certain wavelengths of a laser beam can ensure that the laser to be applied to inorganic wafer 120 will quickly create damage tracks in inorganic wafer 120, while not substantially affecting semiconductor wafer 110 bonded to inorganic wafer 120.

In some embodiments, inorganic wafer 120 is electrically insulative. The resistivity of inorganic wafer 120 is at least $10^5$ Ω-m at room temperature. The breakdown voltage of inorganic wafer 120 is at least 1 kV for the thickness of 0.5 mm at room temperature. The resistivity of inorganic wafer 120 may be $10^5$ Ω-m, $10^6$ Ω-m, $10^7$ Ω-m, $10^8$ Ω-m, $10^9$ Ω-m, $10^{10}$ Ω-m, $10^{11}$ Ω-m, $10^{12}$ Ω-m, $10^{13}$ Ω-m, $10^{14}$ Ω-m, $10^{15}$ Ω-m, $10^{16}$ Ω-m, $10^{17}$ Ω-m, $10^{18}$ Ω-m, $10^{19}$ Ω-m, $10^{20}$ Ω-m, $10^{21}$ Ω-m, $10^{22}$ Ω-m at room temperature, any range bounded on the lower end by any of these values, or in any range defined by any two of these values. The resistivity may be measured in accordance with ASTM C657-93(2013), "Standard Test Method for D-C Volume resistivity of Glass". The breakdown voltage of inorganic wafer 120 may be 1 kV, 5 kV, 10 kV, 20 kV, 50 kV, 100 kV, 200 kV, 500 kV for the thickness of 0.5 mm at room temperature, any range bounded on the lower end by any of these values, or in any range defined by any two of these values. The breakdown voltage may be measured in accordance with ASTM D149-09(2013), "Standard Test Method for Dielectric Breakdown Voltage and Dielectric Strength of Solid Electrical Insulating Materials at Commercial Power Frequencies." In one example, the resistivity of a glass wafer is from $10^7$ Ω-m to $10^{21}$ Ω-m at room temperature. In another example, the resistivity of a fused silica wafer is $7.5 \times 10^{17}$ Ω-m at room temperature. In still another example, the resistivity of a sapphire wafer is $10^{14}$ Ω-m at room temperature. Moreover, as described above, in some embodiments, inorganic wafer 120 is substantially thicker than the oxide layer of a standard SOI wafer. Thus, inorganic wafer 120 can provide better electrical isolation than the oxide layer of a standard SOI wafer.

In some embodiments, inorganic wafer 120 can be chemically etched by etchants in the liquid and/or gaseous forms. In some embodiments, inorganic wafer 120 may be etched by an acid-based etchant. In one example, inorganic wafer 120 may be a glass or fused silica wafer that can be etched by an etchant containing hydrofluoric acid (HF). In another example, inorganic wafer 120 may be a sapphire wafer that can be etched by an etchant containing phosphoric acid ($H_3PO_4$). It is understood that to ensure the selectivity of chemical etching so that semiconductor wafer 110 bonded to the inorganic wafer 120 would not be substantially affected by the chemical etching, the chemical etching may be performed with an etchant that etches inorganic wafer 120 at a first rate and semiconductor wafer 110 at a second rate, where the first rate is at least 10 times the second rate, such as 10 times the second rate, 20 times the second rate, 50 times the second rate, 100 times the second rate, 200 times the second rate, 500 times the second rate, 1,000 times the second rate, 5,000 times the second rate, 10,000 times the second rate, 100,000 times the second rate, any range bounded on the lower end by any of these values, or any range defined by any two of these values.

In some embodiments, semiconductor wafer 110 and inorganic wafer 120 are bonded by various approaches, such as covalent bonding, anodic bonding, or adhesive bonding, to name a few. For covalent bonding, semiconductor wafer 110 and inorganic wafer 120 are cleaned and heated to produce Van der Waals bonding at interface 130 of the semiconductor wafer 110 and inorganic wafer 120. For anodic bonding, semiconductor wafer 110 and inorganic wafer 120 are cleaned, heated, and exposed to a sufficiently powerful electrostatic field. For adhesive bonding, semiconductor wafer 110 and inorganic wafer 120 are cleaned, and an adhesive is applied to one or both of semiconductor wafer 110 and inorganic wafer 120 at a location that will become part or all of interface 130.

In some embodiments, semiconductor wafer 110 may be removably bonded to inorganic wafer 120 using Van der Waals bonding such as disclosed by U.S. Patent Publication No. 2014/0170378, which is hereby incorporated by reference in its entirety. As used herein, a bond is removable if the bonded wafers can be debonded upon application of sufficient separation force without causing catastrophic damage (e.g., breakage) of the wafers. Van der Waals bonding generally includes disposing a surface of an semiconductor wafer 110 on a bonding surface of inorganic wafer 120 and raising a temperature of the article followed by cooling the article to room temperature. The result is the article and the carrier being removably bonded together such that semiconductor wafer 110 and inorganic wafer 120 may be readily removed from each other without damaging either wafer. In some embodiments, either an interface surface of semiconductor wafer 110 and/or inorganic wafer 120 may be modified prior to Van der Waals bonding. For example, a carbonaceous surface modification layer may be deposited on the interface surface of semiconductor wafer 110 and/or inorganic wafer 120 and then polar groups may be incorporated with the surface modification layer as disclosed by U.S. Patent Publication No. 2017/0036419, which is hereby incorporated by reference in its entirety.

In one working example, semiconductor wafer 110 may be a silicon wafer and inorganic wafer 120 may be an alkali-containing alumino-borosilicate glass. The silicon wafer and the glass wafer have a similar coefficient of thermal expansion for anodic bonding. In this embodiment, both the silicon and glass wafers are first cleaned by the standard Radio Corporation of America (RCA) cleaning procedure. The two wafers then are brought into contact and, an electrical potential of 1750 V is applied across the silicon and glass wafers, with the silicon wafer as the anode and the glass wafer as the cathode. The process is carried out at 575° C. for 20 minutes in a vacuum. Subsequently, the potential is removed, and the wafers are cooled to room temperature.

In some embodiments, a laser drilling process may be applied to selectively form damage tracks in inorganic wafers while not substantially affect the bonded semiconductor wafers. As used herein, "damage track" refers to a microscopic (e.g. from 100 nm to 5 µm in diameter) elongated "hole" (also called a perforation, a pilot hole, or a defect line) in a substantially transparent wafer (e.g. inorganic wafer 120) by using a single high-energy burst pulse emitted by a laser. The damage tracks may be very small (e.g. single microns or less) in cross-sectional dimension, but are relatively long—i.e. they have a high aspect ratio. Individual damage tracks can be created at rates of several hundred kilohertz, for example, with relative motion between the laser and the wafer. Multiple damage tracks can be placed adjacent to one another (e.g. spatial separation varying from sub-micron to many microns as desired). In some embodiments, the damage track is a "through hole," which is a hole or an open channel that extends from the top surface to the bottom surface of the transparent wafer. In other embodiments, the damage track is not a true "through hole" because there may be particles of material that block the path of the damage track. Thus, while the damage track can extend from the top surface to the bottom surface of the wafer, in some embodiments it is not a continuous hole or channel because particles of the material are blocking the path. As defined herein, the internal diameter of the damage track is the internal diameter of the open channel or the air hole. In some embodiments, the internal diameter of the damage track is less than 500 nm, for example, 10 nm to 400 nm, 10 nm to 300 nm, 10 nm to 200 nm, or 10 nm to 100 nm. The disrupted or modified area (e.g. compacted, melted, or otherwise changed) of the material surrounding the holes in the embodiments disclosed herein, preferably has a diameter of less than 50 µm, for example 1 µm to 30 µm, or 1 µm to m.

Figure 7:
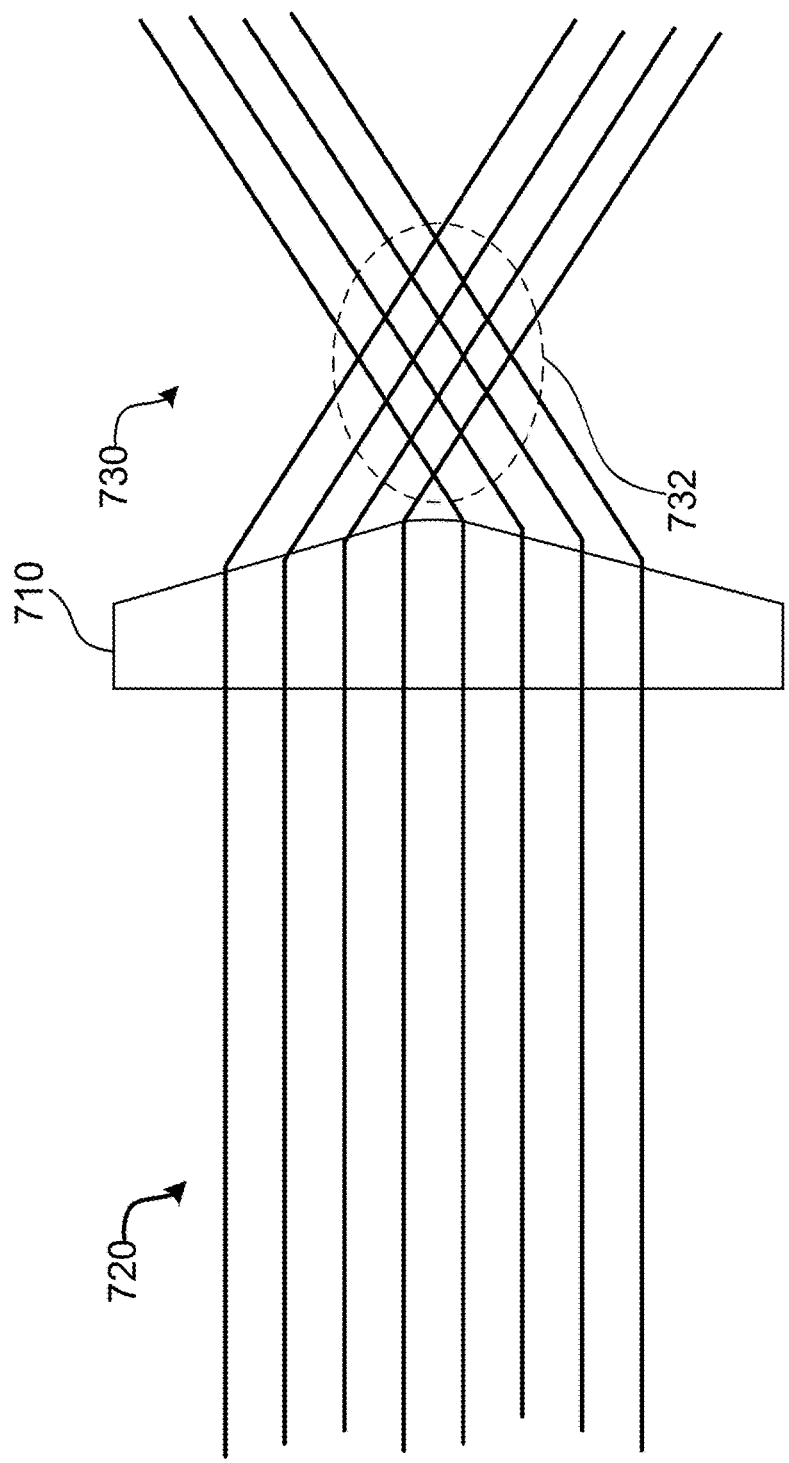
FIG. 7 shows an axicon, which is a type of lens, creating an extended focus of a laser beam.

In some embodiments, the damage tracks can be created by a laser with an optical assembly that creates an extended focus (e.g. a focal line or a plurality focal points) in a wafer that is transparent to the wavelength of the laser beam. In some embodiments, the extended focus is a series of focal points (e.g., 2, 3, 4, or 5 focal points) along the beam propagation direction and occurring within inorganic wafer 120. As shown in FIG. 7, the generation of an extended focus 732 may be performed by sending a Gaussian laser beam 720 to an axicon lens 710, in which case a beam profile known as a Gauss-Bessel beam 730 is created. Such a beam 730 diffracts much more slowly (e.g. may maintain single micron spot sizes for ranges of hundreds of microns or millimeters as opposed to few tens of microns or less) than Gaussian beam 720. A beam may be said to have an extended focus if the beam spot diameter (radial size of the beam at which it first decreases to $1/e^2$ of its peak intensity) increases by less than a square root of 2 when traversing a length more than ten times the Rayleigh length of a typical Gaussian beam of the same spot diameter. Hence the depth of focus or length of intense interaction with the transparent wafer may be much larger than when using Gaussian beam 720 alone. It is understood that other forms or slowly diffracting or non-diffracting beams may also be used, such as Airy beams, Weber beams, or Mathieu beams. A wafer is substantially transparent to the laser wavelength when the absorption is less than 20%, less than 10%, less than 5%, less than 3%, or preferably less than 1% per mm of wafer depth at this wavelength. For example, the absorption is 0.01% to 0.1%, 0.01% to 0.5%, or 0.01% to 1% per mm of wafer depth at this wavelength. Use of the intense laser and line focus allows each laser pulse to simultaneously damage, ablate, or otherwise modify a long (e.g. 100-1000 µm) damage track in the wafer. This damage track can easily extend through the entire thickness of the wafer. Even a single pulse or burst of pulses can thus create the full damage track through the depth of the inorganic substrate, and no percussion drilling is needed.

Figure 8:
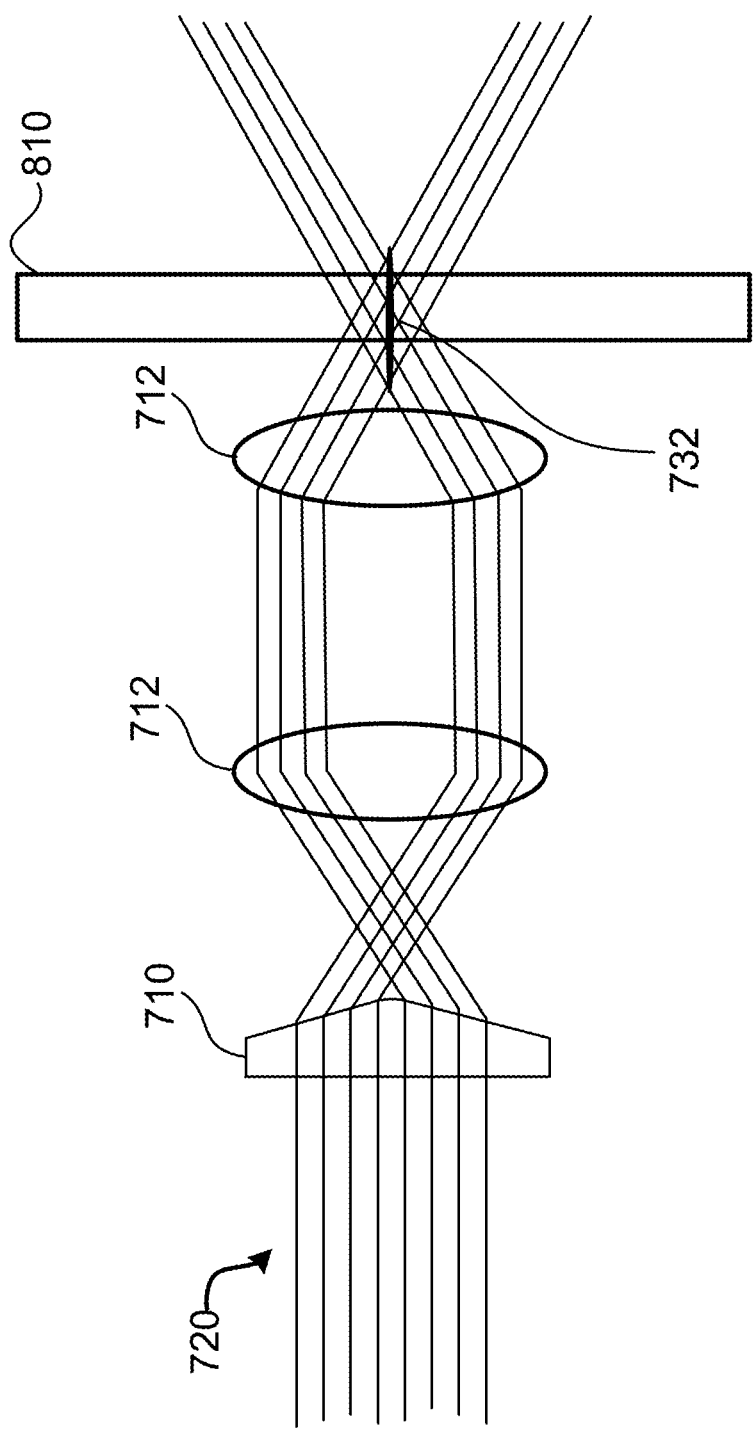
FIG. 8 shows an optical assembly creating a focal line of a laser beam through a transparent wafer.

In some embodiments, FIG. 8 shows an optical assembly including axicon lens 710 and additional optical elements 712 such as focusing lenses. Axicon lens 710 and additional optical elements 712 are positioned perpendicularly to the beam direction and centered on Gaussian laser beam 720. The optical assembly thus creates focal line 732 extending over the entire thickness of a wafer 810 transparent to the wavelength of laser beam 720. In some embodiments, focal line 732 can have a length in a range of between 0.1 mm and 10 mm, such as 1 mm, 2 mm, 3 mm, 4 mm, 5 mm, 6 mm, 7 mm, 8 mm, or 9 mm, or a length in a range of between 0.1 mm and 1 mm, or any range defined by any two of these values, and an average spot diameter in a range of between 0.1 µm and 5 µm.

Figure 9:
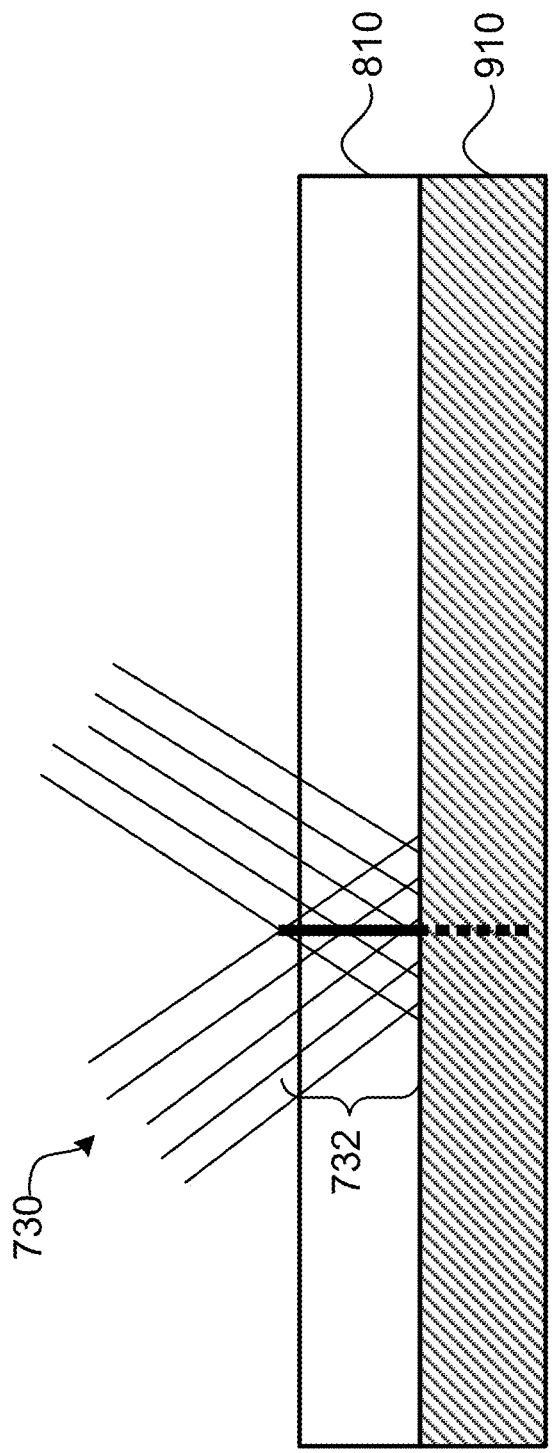
FIG. 9 shows a focal line of a laser beam formed through a transparent wafer and disrupted by an opaque wafer bonded to the transparent wafer.

In some embodiments, as shown in FIG. 9, selective creation of damage tracks only in wafer 810 transparent to the laser wavelength can be achieved by disrupting focal line 732's formation in a bonded wafer 910 that is opaque to the laser wavelength (e.g., semiconductor wafer 110). Opaque wafer 910 may reflect, absorb, scatter, defocus or otherwise interfere with incident laser beam 730 to inhibit or prevent laser beam 730 from damaging or otherwise modifying opaque wafer 910.

Figure 2:
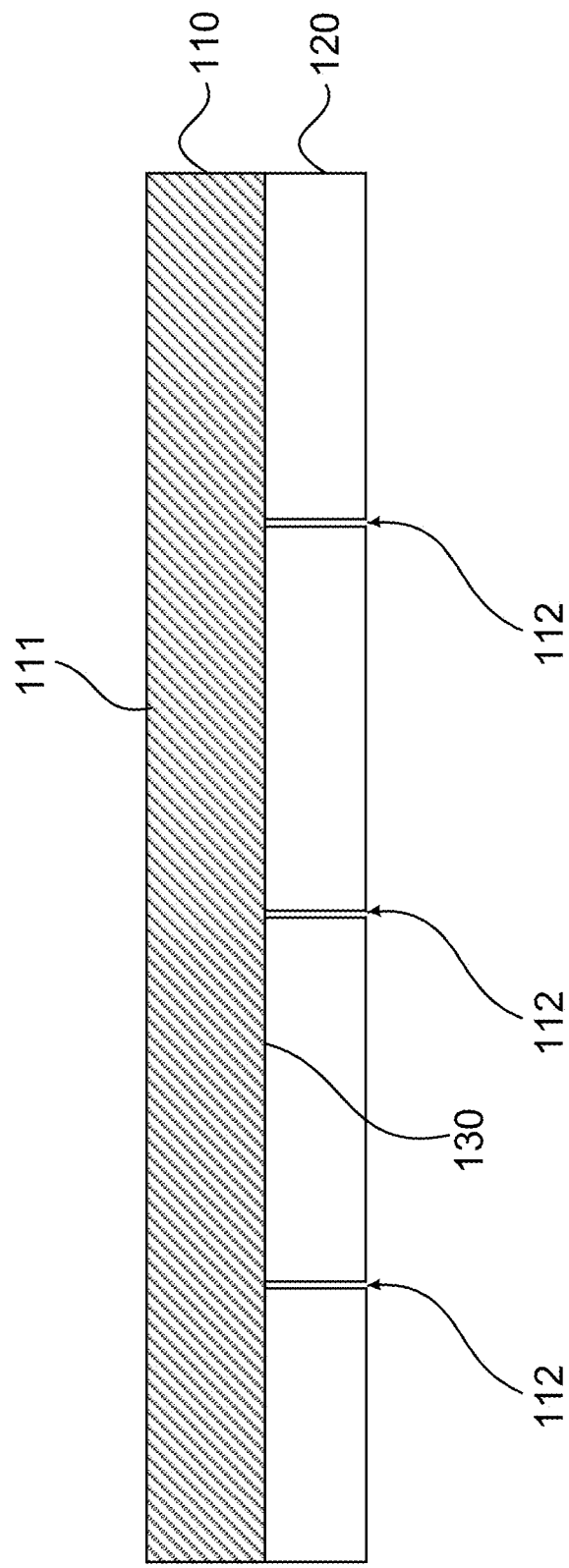
FIG. 2 illustrates forming damage tracks in the inorganic wafer of FIG. 1.

In some embodiments, FIG. 2 illustrates forming damage tracks 112 in inorganic wafer 120 of FIG. 1. After the bonding, a laser (not shown) emits light in a certain wavelength to bonded semiconductor and inorganic wafers 110, 120 to form damage tracks 112 in inorganic wafer 120. Damage tracks 112 do not extend into semiconductor wafer 110. In other words, the laser beam does not substantially affect the surface of semiconductor wafer 110 at interface 130. In some embodiments, the laser beam does not create any marking in semiconductor wafer 110 deeper than 10 um, for example not deeper than 1 um. In some embodiments, even if certain damages on the surface of semiconductor wafer 110 are caused by the laser beam, the damages are so minor that they will not form divots during the subsequent etching step. As shown in FIG. 2, each damage track 112 terminates at interface 130. That is, damage track 112 extends from the top surface to the bottom surface of inorganic wafer 120 in the thickness direction. It is understood the in some embodiments, at least one of damage tracks 112 terminates within inorganic wafer 120. In other words, damage track 112 does not extend completely to the surface of inorganic wafer 120 at interface 130. In one example, at least one damage track 112 terminates within the inorganic wafer, closer to interface 130 than the radius of a corresponding hole to be enlarged by chemical etching. That is, even damage track 112 may not extend to the surface of inorganic wafer 120 at interface 130, by subsequently applying chemical etching to damage track 112, the depth of damage track 112 is increased, so that a corresponding hole can still be formed through inorganic wafer 120, i.e., extending to the surface of inorganic wafer 120 at interface 130. In some embodiments, there may be regions of inorganic material that plug damage tracks 112, but they are generally small in size, on the order of microns, for example, and can thus be removed by the subsequent chemical etching process.

In some embodiments, damage tracks 112 generally take the form of holes with interior dimensions in the range of 0.1 µm to 2 µm, for example, from 0.1 µm to 1.5 m. Preferably, damage tracks 112 formed by the laser drilling are very small (e.g. single microns or less) in dimension. In some embodiments, damage tracks 112 are from 0.2 µm to 0.7 µm in diameter. As described above, in some embodiments, damage tracks 112 may not be continuous holes or channels. The diameter of damage tracks 112 can be 5 µm or less, 4 µm or less, 3 µm or less, 2 µm or less, or 1 µm or less, or any range defined by any two of these values. In some embodiments, the diameter of damage tracks 112 can be in a range from 100 nm to 2 µm, or 100 nm to 0.5 µm. The diameter of damage tracks 112 may be measured using an optical microscope.

In some embodiments, the lateral spacing (pitch) between damage tracks 112 is determined by the pulse or burst repetition rate of the laser. When forming damage tracks 112, the distance, or periodicity, between adjacent damage tracks 112 can depend upon the desired pattern of throughholes (i.e., the holes formed after the etching process). For example, in some embodiments, the desired pattern of damage tracks 112 (and the resultant through-holes that are formed therefrom after etching) is an aperiodic pattern of irregular spacing. They need to be at locations where traces will be laid on the interposer or where specific electrical connections on the interposer to the chips are going to be placed. In some embodiments, damage tracks 112 can have a spacing between adjacent damage tracks 112 of 10 µm or greater, 20 µm or greater, 30 µm or greater, 40 µm or greater, 50 µm or greater, or any range defined by any two of these values. In some embodiments, the spacing can be up to 20 mm. In some embodiments, the spacing can be from 50 µm to 500 µm, or from 10 µm and 50 µm.

In some embodiments, the laser for creating damage tracks 112 include a Nd:YAG, Nd:YVO4, Yb:KGW, or Ti:sapphire laser, with fundamental wavelengths or harmonics, including for example, 257 nm, 266 nm, 343 nm, 355 nm, 515 nm, 530 nm, 532 nm, 1030 nm, and 1064 nm. In some embodiments, the laser is a very high pulse energy short pulsed laser (e.g. less than 10 psec pulse width, approximately 50 to 500 uJ/burst). Many short pulse lasers allow a mode of operation called "burst" pulse mode. A "burst" pulse is a sequence of pulses that are closely spaced in time (e.g. 20 nsec), whereas the time between each "burst" may be longer, such as 10 µsec. Since the gain medium for such lasers has a fixed amount of energy that can be extracted on a short time scale, typically the total energy within a burst is conserved, i.e. if the laser is operated at a constant frequency, then the total energy within a two pulse burst will be the same as the total energy within a six pulse burst. Each pulse is focused to a line and, through the process of non-linear absorption, creates damage track 112 within inorganic wafer 120. In this embodiment, inorganic wafer 120 is substantially transparent to the radiation (typically <10% absorption per mm), otherwise the energy will be absorbed at or near the surface of inorganic wafer 120 and not reach interface 130.

In some embodiments, the operation of such a short pulse laser described herein creates a "burst" of pulses. Each "burst" (also referred to herein as a "pulse burst") contains multiple individual pulses (such as at least 2 pulses, at least 3 pulses, at least 4 pulses, at least 5 pulses, at least 10 pulses, at least 15 pulses, at least 20 pulses, or more) of very short duration. That is, a pulse bust is a "packet" of pulses, and the bursts are separated from one another by a longer duration than the separation of individual adjacent pulses within each burst. Pulses have pulse duration of up to 100 psec (for example, 0.1 psec, 5 psec, 10 psec, 15 psec, 18 psec, 20 psec, 22 psec, 25 psec, 30 psec, 50 psec, 75 psec, or any range defined by any two of these values). The energy or intensity of each individual pulse within the burst may not be equal to that of other pulses within the burst, and the intensity distribution of the multiple pulses within a burst often follows an exponential decay in time governed by the laser design. Preferably, each pulse within the burst of the exemplary embodiments described herein are separated in time from the subsequent pulse in the burst by a duration from 1 nsec to 50 nsec (e.g. 10-50 nsec, or 10-30 nsec, with the time often governed by the laser cavity design). For a given laser, the time separation between each pulse (pulse to pulse separation) within a burst is relatively uniform (e.g. ±10%). For instance, in some embodiments, each pulse within a burst is separated in time from the subsequent pulse by approximately 20 nsec (50 MHz). For example, for a laser that produces pulse separation of 20 nsec, the pulse to pulse separation within a burst is maintained within ±10%, or is ±2 nsec. The time between each "burst" of pulses (i.e. time separation between bursts) will be much longer (e.g., 0.25-1000 msec, for example, 1-10 µsec, or 3-8 µsec). In some of the exemplary embodiments of the laser described herein, the time separation is around 5 µsec for a laser with burst repetition rate or frequency of 200 kHz. The laser burst repetition rate (also referred to as burst repetition frequency herein) is defined as the time between the first pulse in a burst to the first pulse in the subsequent burst. In some embodiments, the burst repetition frequency may be in a range of between 1 kHz and 4 MHz. More preferably, the laser burst repetition rates can be, for example, in a range of between 10 kHz and 650 kHz. The time between the first pulse in each burst to the first pulse in the subsequent burst may be 0.25 µsec (4 MHz burst repetition rate) to 1,000 µsec (1 kHz burst repetition rate), for example, 0.5 µsec (2 MHz burst repetition rate) to 40 sec (25 kHz burst repetition rate), or 2 µsec (500 kHz burst repetition rate) to 20 sec (50 k Hz burst repetition rate). The exact timings, pulse durations, and burst repetition rates can vary depending on the laser design, but short pulses (less than 20 psec and preferably less than 15 psec) of high intensity have been shown to work particularly well.

In some embodiments, the required energy to modify inorganic wafer 120 can be described in terms of the burst energy—the energy contained within a burst, or in terms of the energy contained within a single laser pulse. The energy per burst can be from 25-750 µJ, more preferably 50-500 µJ, or 50-250 µJ. In some embodiments, the energy per burst is 100-250 µJ. The energy of an individual pulse within the pulse burst will be less, and the exact individual laser pulse energy will depend on the number of pulses within the pulse burst and the rate of decay (e.g. exponential decay rate) of the laser pulses with time. For example, for a constant energy burst, if a pulse burst contains 10 individual laser pulses, then each individual laser pulse will contain less energy than if the same pulse burst had only two individual laser pulses.

The use of laser capable of generating such pulse bursts is advantageous for creating damage tracks 112 in inorganic wafer 120, for example, a glass wafer. In contrast with the use of single pulses spaced apart in time by the repetition rate of the single-pulse laser, the use of a pulse burst sequence that spreads the laser energy over a rapid sequence of pulses within the burst allows access to larger timescales of high intensity interaction with inorganic wafer 120 than is possible with single-pulse lasers. While a single-pulse can be expanded in time, as this is done the intensity within the pulse must drop as roughly one over the pulse width. Such a reduction can reduce the optical intensity to the point where non-linear absorption is no longer significant, and light material interaction is no longer strong enough to allow for drilling. In contrast, with a pulse burst laser, the intensity during each pulse within the burst can remain very high.

In some embodiments, the damage tracks formed by laser drilling are enlarged by chemical etching to form through-holes. Use of chemical etching to enlarge the damage tracks to form through-holes can have a number of benefits: 1) chemical etching can change the damage tracks from a size (e.g. 1 µm) that is too small to practically metalize and use for interposers to more convenient size (e.g. 4 µm or higher); 2) etching can take what may start as a non-contiguous hole or simply a damage track through the wafer and etch it out to form a continuous though-hole via; 3) etching is a highly parallel process where all of the damage tracks in the wafer are enlarged at the same time, which is much faster than what would happen if a laser had to re-visit the hole and drill out more wafer material to enlarge it; and 4) etching helps blunt any edges or small cracks within the damage tracks, increasing the overall strength and reliability of the wafer.

In some embodiments, FIG. 3 illustrates enlarging damage tracks 112 of FIG. 2 to form holes 114 through inorganic wafer 120. Each hole 114 terminates at interface 130 between semiconductor wafer 110 and inorganic wafer 120. In FIG. 3, interface 130 is the plane or curved surface defined by the parts of inorganic wafer 120 not removed, extrapolated through holes 114. A diameter of each hole 114 at the surface opposite the interface may be from 4 µm to 100 µm, such as from 5 µm to 80 µm, from 10 µm to 50 µm, or from 15 µm to 30 µm. As shown in FIG. 3, in some embodiments, the cross-section of each hole 114 may be in a trapezoid or hourglass shape. Each hole 114 may include a first opening in the surface not bonded to semiconductor wafer 110, a second opening in the surface at interface 130, and a waist between the first and second openings. In some embodiments, the diameter of the waist of each hole 114 is from 50% to 100% of the diameter of the first and/or second opening of hole 114.

Because chemical etching is performed after semiconductor wafer 110 has been bonded to inorganic wafer 120, a significant portion of the surface area of the inorganic wafer 120 at interface 130 is covered by the opposing surface of semiconductor wafer 110 during etching, and will not be exposed to the etchant during the chemical etching. So, a relatively smooth surface of the inorganic wafer 120 at interface 130 can be achieved, with an average surface roughness (Ra) of less than 1 nm, less than 0.3 nm, or less than 0.2 nm. In some embodiments, the average surface roughness (Ra) is 0.1 nm to 1 nm, 0.1 nm to 0.3 nm, or 0.1 nm to 0.2 nm. As used herein the average surface roughness $R_a$ is measured over a 100 µm by 100 µm sized area and defined as the arithmetic average of the differences between the local surface heights and the average surface height and can be described by the following equation:

$$R_a = \frac{1}{n}\sum_{i=1}^{n} |y_i|$$

where $y_i$ is the local surface height relative to the average surface height. The average surface roughness $R_a$ can be measured using an atomic force microscope (AFM), for example the Dimension Icon available from Veeco. Lower average surface roughness (Ra) may be achieved, limited only by the smoothness achievable by semiconductor and glass processing. In some embodiments in which the inorganic wafer 120 is an alumino-borosilicate glass, interface 130 has the properties of fusion formed glass with the average surface roughness (Ra) being less than 1 nm and having no concentration of tin (Sn) near the outer surface, or marks from polishing, which are common signatures of float formed glass sheets. In contrast, any similar article made with forming the holes prior to bonding the two wafers would have issues with the bonded surface of the inorganic wafer being roughened by the etching.

As described above, in some embodiments in which the inorganic wafer 120 is an alumino-borosilicate glass or a fused silica wafer, HF-containing acid etchants can be used to selectively enlarge damage tracks 112 in the inorganic wafer 120, while not substantially etching semiconductor wafer 110. In one working example, an etchant having 5% HF and 10% HNO$_3$ by volume is used at room temperature with ultrasonic mixing for enhancing diffusion of the etchant into holes 114. This can result in an etch removal rate of the glass wafer of 0.5 µm/min. On the other hand, exposure to aqueous HF-based etchants will not erode semiconductor wafer 110, for example, a silicon wafer, very quickly, because HF more readily attacks Si—O bonds. This is particularly the case if only low levels of HNO$_3$ (or none at all) are present in the etchant, since HNO$_3$ can act as an oxidant of the surface of the Si, which allows the HF to more readily attack the Si through Si—O—Si bonds. Hence glass or fused silica will be eroded much more rapidly by the HF etchant, whereas a silicon wafer will remain relatively unaffected.

In some embodiments in which the inorganic wafer 120 is a sapphire wafer, $H_3PO_4$-containing acid etchant can be used to selectively enlarge damage tracks 112 in the inorganic wafer 120, while not substantially etch semiconductor wafer 110. In one working example, the etchant having 50% $H_3PO_4$ and 50% $H_2SO_4$ by volume is used at 160° C. for enlarging holes 114 through the sapphire wafer.

Once holes 114 reach to the desired size and pattern, a resultant article 100 is formed, which includes semiconductor wafer 110 bonded to inorganic wafer 120 through which holes 114 are formed. Holes 114 terminate at interface 130 between semiconductor wafer 110 and the inorganic wafer 120. As described above, semiconductor wafer 110 is opaque to a wavelength of light to which the inorganic wafer 120 is transparent. The wavelength may be fundamental wavelengths or harmonics of Nd:YAG, Nd:YVO4, Yb:KGW, and Ti:sapphire lasers, such as 257 nm, 266 nm, 343 nm, 355 nm, 515 nm, 530 nm, 532 nm, 1030 nm, or 1064 nm. In some embodiments, the thickness of inorganic wafer 120 is from 10 μm to 1 mm, such as from 50 μm to 250 μm, or from 50 μm to 100 μm. In some embodiments, semiconductor wafer 110 is a bare wafer without any device component formed on or in semiconductor wafer 110.

Additionally or optionally, in some embodiments, holes 114 are metalized. In some embodiments, FIG. 4 illustrates metalizing the surfaces of holes 114 of FIG. 3. The surfaces of holes 114 may be coated and/or filled with conductive material 116, for example, through metallization, in order to create an interposer part made of the inorganic wafer 120. The metal or conductive material can be, for example, copper (Cu), aluminum (Al), gold (Au), silver (Ag), lead (Pb), tin (Sn), indium tin oxide (ITO), or a combination or alloy thereof. The process used to metalize the surfaces of holes 114 can be, for example, electro-plating, electrolysis plating, physical vapor deposition, or other evaporative coating methods. Holes 114 may also be with conductive paste containing glass frit, and the desired functionality achieved by using a sintering process after introduction of the frit into holes 114. Holes 114 may also be coated with catalytic materials, such as platinum (Pt), palladium (Pd), titanium dioxide ($TiO_2$), or other materials that facilitate chemical reactions within holes 114. Alternatively, holes 114 may be coated with other chemical functionalization, so as to change surface wetting properties or allow attachment of biomolecules, and used for biochemical analysis. Such chemical functionalization could be silanization of the surfaces of holes 114, and/or additional attachment of specific proteins, antibodies, or other biologically specific molecules, designed to promote attachment of biomolecules for desired applications. It is understood that in some embodiments, conductive material 116 is not only formed a layer on the surface of a hole 114, but is filled with entire hole 114 to achieve a lower electrical resistance.

Figure 5:
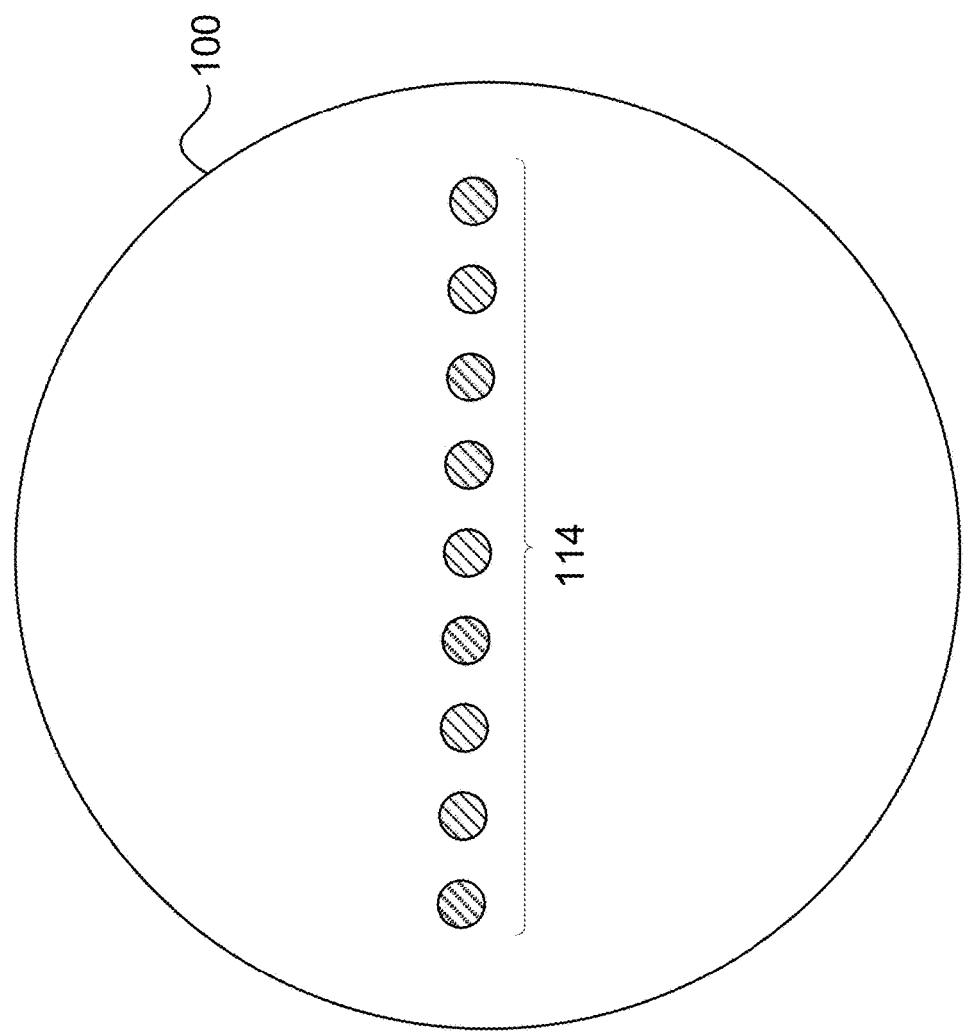
FIG. 5 shows a plan view of the resultant article of FIGS. 3 and 4 having a semiconductor wafer bonded to an inorganic wafer. The inorganic wafer has holes therethrough arranged in a pattern.

FIG. 5 shows a plan view of article 100 having semiconductor wafer 110 bonded to the inorganic wafer 120. Holes 114 are formed through the inorganic wafer 120 and are arranged in a pattern. The pattern can be predefined according to the applications of article 100, and holes 114 can be quickly formed in parallel by the laser drilling and chemical etching processes as described above in detail. For example, in some embodiments, the desired pattern of holes 114 is an aperiodic pattern of irregular spacing. They need to be at locations where traces will be laid on the interposer or where specific electrical connections on the interposer to the chips are going to be placed.

Figure 11:
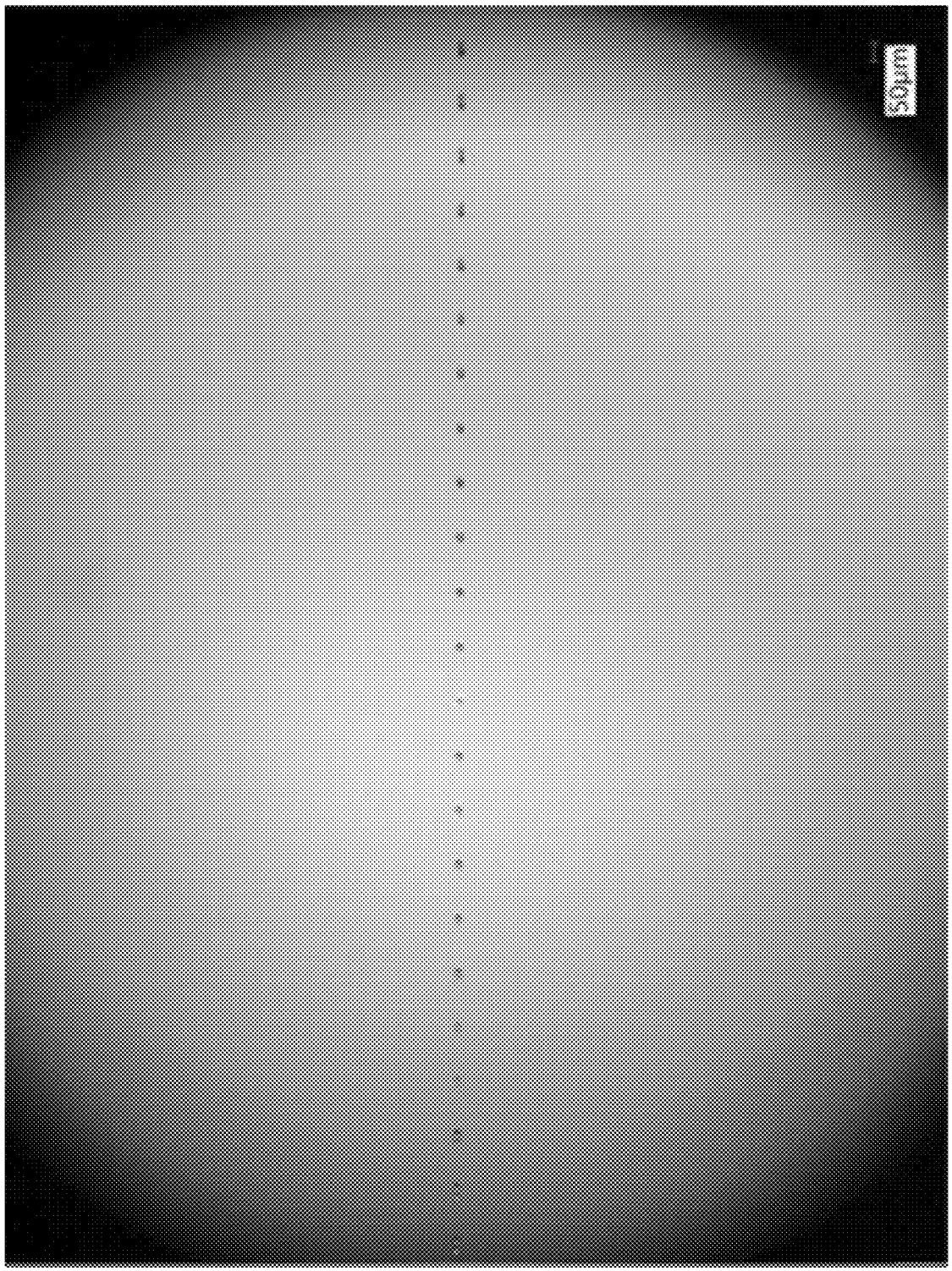
FIG. 11 depicts a plan-view image of holes formed through a glass wafer bonded to a silicon wafer. The diameter of each hole is 11 μm.
Figure 12:
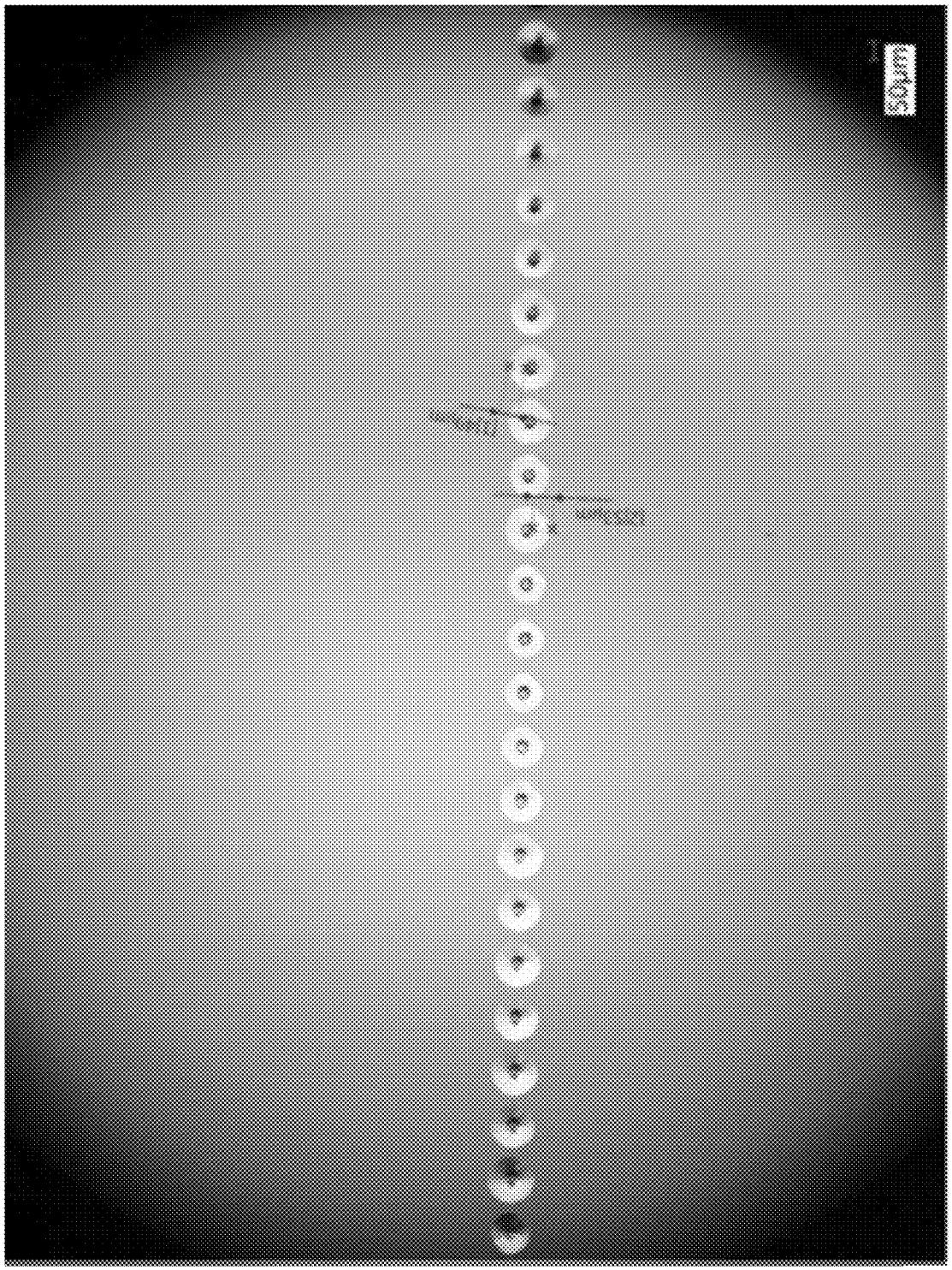
FIG. 12 depicts another plan-view image of holes formed through a glass wafer bonded to a silicon wafer. The diameter of each hole is 17.5 μm.

FIG. 11 depicts a plan-view image of holes formed through a glass wafer bonded to a silicon wafer. The diameter of each hole is 11 μm. In this example, the bonded silicon and glass wafer was first drilled by a laser with a 532 nm wavelength, a focal line length of approximately 0.5 mm, a focal spot diameter of 1.2 μm, and laser burst pulse energies in the range of 40-100 uJ. In this example, the etchant used was 5% HF and 10% $HNO_3$ by volume, at 20° C. and with ultrasonic mixing. This resulted in a etch removal rate of the glass of ~0.5 μm/min. No detectable thinning of the silicon wafer was measured, while the glass wafer was thinned, and the holes were enlarged by many tens of microns, with the exact amount depending on the exact chemical etching time. FIG. 12 depicts another plan-view image of holes formed through the glass wafer bonded to the silicon wafer under the same conditions as in FIG. 11 except for a longer chemical etching time. The diameter of each hole is 17.5 μm.

Figure 13:
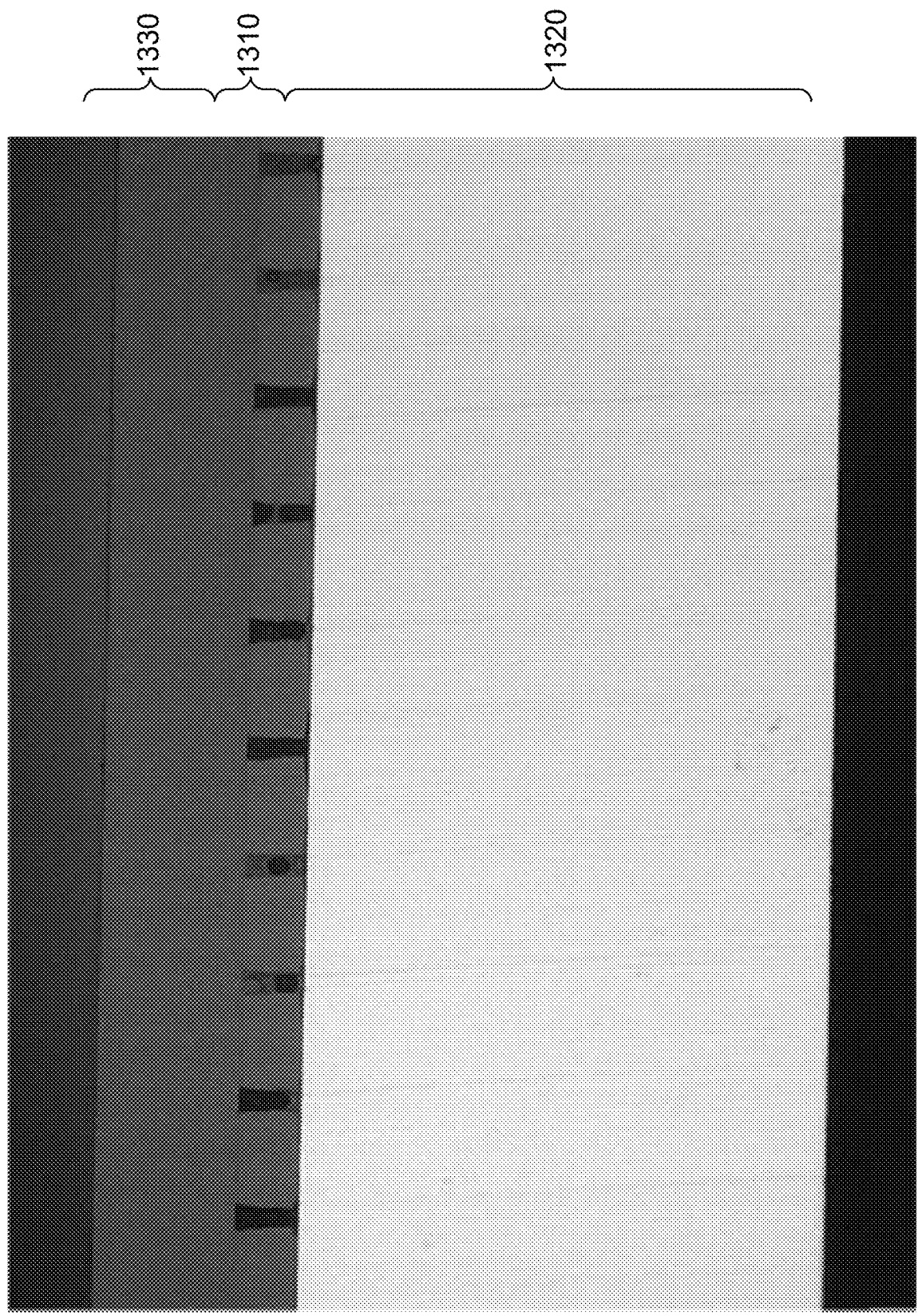
FIG. 13 depicts a side-view image of holes formed through a glass wafer bonded to a silicon wafer. The thickness of the glass wafer and silicon wafer is 80 μm and 700 μm, respectively.

FIG. 13 depicts a side-view image of holes formed through a glass wafer 1310 bonded to a silicon wafer 1320. The thickness of glass wafer 1310 and silicon wafer 1320 is 80 μm and 700 μm, respectively. A glass cover 1330 is attached to glass wafer 1310 to merely to facilitate polishing for edge profile. No evidence of damage to the surface of silicon wafer 1320 was found at the interface between glass and silicon wafers 1310, 1320 caused by laser drilling and/or chemical etching.

Figure 6:
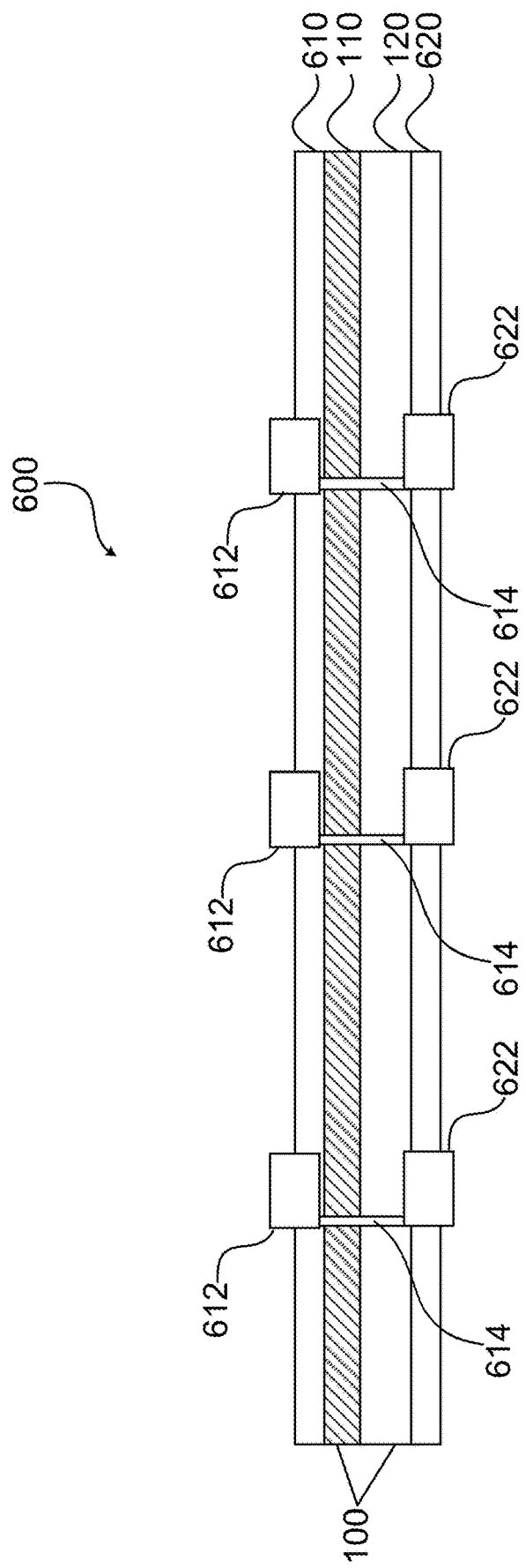
FIG. 6 shows a side view of a device formed on the resultant article of FIGS. 3 to 5.

Article 100 of FIGS. 3 to 5 can be used as an interposer for physical, optical, and/or electrical connection to other devices formed utilizing semiconductor wafer 110 and/or inorganic wafer 120. In some embodiments, FIG. 6 shows a side view of a device 600 formed utilizing article 100 of FIGS. 3 to 5. One or more additional layers 610 are formed on semiconductor wafer 110, such as but not limited to metal layers, epitaxial layers, insulating layers, etc. Device components 612 are formed on or in additional layers 610 and semiconductor wafer 110. In some embodiments, one or more additional layers 620 may be formed on the inorganic wafer 120 as well. Device components 622 may be formed on or in additional layers 620 and the inorganic wafer 120. Device components 612, 622 may include, for example, active device components (e.g. diodes, transistors, etc.) and passive device components (e.g. resistors, capacitors, etc.) of a microelectronic device, RF device components (e.g. transmission lines, resonators, etc.) of a RF device, optoelectronic device components (e.g. waveguides, lenses, mirrors, etc.) of an optoelectronic device, and MEMS device components (e.g. diaphragms, cantilevers, cavities, etc.) of an MEMS device.

In some embodiments, device components 612, 622 on the different sides of article 100 can be physically, optically, and/or electrically connected by vias 614 through semiconductor wafer 110 and the inorganic wafer 120. Each via 614 includes a corresponding hole 114 through the inorganic wafer 120 as shown in FIGS. 4 and 5 and another hole through semiconductor wafer 110 that is connected to the corresponding hole 114. In some embodiments in which semiconductor wafer 110 is a silicon wafer, through silicon vias (TSVs) may be formed in the silicon wafer to connect with existing holes 114 through the inorganic wafer 120 in article 100.

Figure 10:
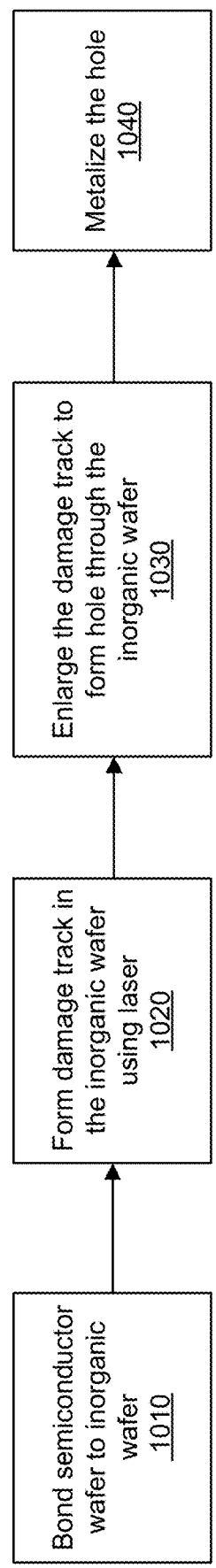
FIG. 10 shows a process flowchart corresponding to the process illustrated in FIGS. 1 to 4.

FIG. 10 shows an exemplary process flowchart corresponding to the process illustrated in FIGS. 1 to 4. The process can include further steps or may include less than all of the steps illustrated in further examples. As shown, the process starts from step 1010 of bonding. Semiconductor wafer 110 is bonded to the inorganic wafer 120, for example, by anodic bonding. After the bonding, at step 1020, damage track(s) 112 are formed in the inorganic wafer 120 using a laser emitting a certain wavelength of light. Semiconductor wafer 110 is opaque to the wavelength of light, while the inorganic wafer 120 is transparent to the wavelength of light. At step 1030, damage track(s) 112 in the inorganic wafer 120 are enlarged to form hole(s) 114 through the inorganic wafer 120 by chemical etching. Hole(s) 114 terminate at interface 130 between semiconductor wafer 110 and the inorganic wafer 120. Additionally or optionally, at step 1040, hole(s) 114 through the inorganic wafer 120 are metalized.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments, but should be defined only in accordance with the following claims and their equivalents.

What is claimed is:

1. An article, comprising:
   a semiconductor wafer bonded to an inorganic wafer, wherein the semiconductor wafer is opaque to a wavelength of light to which the inorganic wafer is transparent,
   the inorganic wafer having a hole formed therethrough, the hole terminating at a surface of the semiconductor wafer, and
   a thickness of the semiconductor wafer being greater than a thickness of the inorganic wafer.

2. The article of claim 1, wherein the semiconductor wafer is a bare semiconductor wafer.

3. The article of claim 1, wherein the semiconductor wafer is a silicon wafer.

4. The article of claim 1, wherein the inorganic wafer has a resistivity of at least $10^5$ Ω-m at room temperature and a breakdown voltage of at least 1 kV for the thickness of 0.5 mm at room temperature.

5. The article of claim 1, wherein the inorganic wafer is made of a material selected from the group consisting of alumino-borosilicate glass, fused silica, and sapphire.

6. The article of claim 1, wherein the thickness of the inorganic wafer is from 10 μm to 1 mm.

7. The article of claim 6, wherein the thickness of the inorganic wafer is from 50 μm to 250 μm.

8. The article of claim 1, wherein the hole is metalized.

9. The article of claim 8, wherein a diameter of the hole at a surface of the inorganic wafer opposite an interface between the semiconductor wafer and the inorganic wafer is from 4 μm to 100 μm.

10. The article of claim 1, wherein the average surface roughness (Ra) of the inorganic wafer at an interface between the semiconductor wafer and the inorganic wafer is less than 1 nm.

11. The article of claim 1, wherein the semiconductor wafer is removably bonded to the inorganic wafer.

12. The article of claim 1, wherein the surface of the semiconductor wafer, at which the hole terminates, contacts the inorganic wafer.

13. The article of claim 1, wherein the semiconductor wafer is bonded to the inorganic wafer at an interface, the interface being a direct connection between the semiconductor wafer and the inorganic wafer.

* * * * *

UNITED STATES PATENT AND TRADEMARK OFFICE
CERTIFICATE OF CORRECTION

PATENT NO. : 10,756,003 B2
APPLICATION NO. : 16/179048
DATED : August 25, 2020
INVENTOR(S) : Daniel Wayne Levesque, Jr. et al.

It is certified that error appears in the above-identified patent and that said Letters Patent is hereby corrected as shown below:

On the Title Page

On page 4, in Column 2, item (56), Other Publications, Line 17, delete "(2009." and insert -- (2009). --, therefor.

On page 5, in Column 1, item (56), Other Publications, Line 13 (approx.), delete "https:/fweb" and insert -- https://web --, therefor.

On page 5, in Column 1, item (56), Other Publications, Line 26 (approx.), delete "(2015." and insert -- (2015). --, therefor.

On page 5, in Column 1, item (56), Other Publications, Line 34 (approx.), delete "Microelectronis" and insert -- Microelectronics --, therefor.

On page 5, in Column 2, item (56), Other Publications, Line 41 (approx.), delete "ofterephthalic" and insert -- of terephthalic --, therefor.

Signed and Sealed this
Third Day of November, 2020

Andrei Iancu
*Director of the United States Patent and Trademark Office*